US010727100B2

(12) United States Patent
Ochiai et al.

(10) Patent No.: US 10,727,100 B2
(45) Date of Patent: Jul. 28, 2020

(54) LOAD PORT AND EFEM

(71) Applicant: SINFONIA TECHNOLOGY CO., LTD., Tokyo (JP)

(72) Inventors: Mitsutoshi Ochiai, Tokyo (JP); Takaaki Nakano, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 16/394,344

(22) Filed: Apr. 25, 2019

(65) Prior Publication Data

US 2019/0252228 A1    Aug. 15, 2019

Related U.S. Application Data

(62) Division of application No. 14/607,667, filed on Jan. 28, 2015, now Pat. No. 10,340,168.

(30) Foreign Application Priority Data

Jan. 28, 2015 (JP) ................................ 2014-017819

(51) Int. Cl.
H01L 21/67        (2006.01)
H01L 21/677       (2006.01)

(52) U.S. Cl.
CPC .. H01L 21/67775 (2013.01); H01L 21/67126 (2013.01); H01L 21/67772 (2013.01)

(58) Field of Classification Search
CPC ......... H01L 21/67663; H01L 21/67772; H01L 21/67775
See application file for complete search history.

(56) References Cited

U.S. PATENT DOCUMENTS 5,730,801 A  *  3/1998  Tepman .............. H01L 21/6719
                                                    118/719
5,895,191 A     4/1999  Bonora et al.
(Continued)

FOREIGN PATENT DOCUMENTS

JP      5-109863 A      4/1993
JP      9-139410 A      5/1997
(Continued)

OTHER PUBLICATIONS

Office Action dated Sep. 12, 2017, issued in counterpart Japanese Application No. 2014-017819, with English machine translation. (6 pages).

(Continued)

Primary Examiner — Saul Rodriguez
Assistant Examiner — Ashley K Romano
(74) Attorney, Agent, or Firm — Westerman, Hattori, Daniels & Adrian, LLP

(57) ABSTRACT

A load port provided adjacent to a wafer transport chamber for taking in and out a wafer W between the wafer transport chamber and a FOUP, includes a plate-shaped part that constitutes a part of a wall of the wafer transport chamber, and has an opening for opening the wafer transport chamber; a door part for opening and closing the opening; a mounting table that is configured to mount a wafer storage container so as to oppose a lid part for opening and closing an internal space to the door part, and to move to and from the plate-shaped part; and an elastic part that is provided on the mounting table side of the plate-shaped part along the peripheral edge of the opening, wherein the elastic part elastically contacts the periphery of the lid part in the wafer storage container by moving the mounting table toward the plate-shaped part.

15 Claims, 20 Drawing Sheets

(56) References Cited

U.S. PATENT DOCUMENTS

| | | |
|---|---|---|
| 6,896,470 B1 | 5/2005 | Chen et al. |
| 7,187,994 B1 | 3/2007 | Ashkenaz et al. |
| 7,523,769 B2 | 4/2009 | Miyajima et al. |
| 7,568,875 B2 | 8/2009 | Le Guet et al. |
| 8,171,964 B2 | 5/2012 | Okabe |
| 2008/0112784 A1 | 5/2008 | Rogers et al. |
| 2011/0188977 A1 | 8/2011 | Toyoda et al. |
| 2011/0215028 A1 | 9/2011 | Igarashi et al. |
| 2017/0178942 A1 | 6/2017 | Sakata et al. |
| 2018/0130687 A1* | 5/2018 | Bonecutter ....... H01L 21/67775 |

FOREIGN PATENT DOCUMENTS

| | | |
|---|---|---|
| JP | 11-63604 A | 3/1999 |
| JP | 2000-164688 A | 6/2000 |
| JP | 2001-156142 A | 6/2001 |
| JP | 2002-246456 A | 8/2002 |
| JP | 2002-357271 A | 12/2002 |
| JP | 2002-359180 A | 12/2002 |
| JP | 2004-311940 A | 11/2004 |
| JP | 2006-074033 A | 3/2006 |
| JP | 2006-228808 A | 8/2006 |
| JP | 2006-286682 A | 10/2006 |
| JP | 2008-210881 A | 9/2008 |
| JP | 2012-49382 A | 3/2012 |
| JP | 4921741 B2 | 4/2012 |
| JP | 2014-112631 A | 6/2014 |

OTHER PUBLICATIONS

Office Action dated Dec. 5, 2017, issued in counterpart Taiwanese Application No. 103139047 (6 pages).

Decision of Refusal dated Apr. 8, 2019, issued in counterpart JP application No. 2018-023684, with English translation. (8 pages).

* cited by examiner

Fig. 7

LOAD PORT AND EFEM

CROSS-REFERENCE TO RELATED APPLICATIONS

This application is a divisional of U.S. patent application Ser. No. 14/607,667 filed on Jan. 28, 2015, which claims priority of Japanese Patent Application No. 2014-017819 filed on Jan. 31, 2014. The contents of the applications are incorporated herein by reference in their entirety.

BACKGROUND OF THE INVENTION

1. Field of the Invention

Embodiments of the present invention relate to a load port capable of reducing the use amount of gas even when the interior of a wafer transport chamber is set to a special atmosphere, and an EFEM having the same.

2. Description of the Related Art

Conventionally, production of semiconductors has been carried out by various processing steps performed on a wafer. In recent years, circuit miniaturization and high integration of elements have been increasingly promoted. It has been required to maintain a high level of cleanliness around a wafer to prevent adhesion of water and particles to a surface of a wafer. Further, to prevent changes in properties of a surface of a wafer, such as oxidization, it has been performed to make a periphery of a wafer vacuum or nitrogen atmosphere that is an inert gas.

In order to properly maintain such an atmosphere around a wafer, a wafer is managed by placing in a sealable storage pod called a Front-Opening Unified Pod (FOUP), and nitrogen is filled inside the pod. Further, to transfer a wafer between a FOUP and a processing apparatus for processing a wafer, an equipment front end module (EFEM) as disclosed in Japanese Unexamined Patent Application Publication No. 2012-49382 is provided. An EFEM constitutes a wafer transport chamber that is substantially closed inside a housing, comprises a load port that functions as an interface unit between the FOUP on one of opposite walls, and is connected to a load lock chamber that is a part of a processing apparatus on the other of the walls. In a wafer transport chamber, a wafer transport apparatus for transporting a wafer is provided. By using a wafer transport apparatus, a wafer is loaded and unloaded between a load lock chamber and a FOUP connected to a load port.

In other words, a wafer is taken out of the FOUP (a load port) that is one transfer position by using the wafer transport apparatus, and transported to the load lock chamber that is the other transfer position. The processing apparatus performs processing for a wafer transported through the load lock chamber within a processing apparatus called a process chamber. After the processing is completed, the wafer is taken out through the load lock chamber, and returned to the FOUP.

The interior of the processing apparatus is set in a special atmosphere, a vacuum or the like in accordance with the processing, to enable quickly the processing for a wafer. The interior of the wafer transport chamber in the EFEM is kept in a clean air atmosphere at a high level of cleanliness by introducing the air cleaned through a chemical filter or the like, to prevent contamination due to adhesion of particles or the like to the surface of a wafer during transport.

In recent years, as high integration and miniaturization have been advanced more and more, although the cleanliness is relatively high in the wafer transport chamber of EFEM, the influence of the air atmosphere different from the interior of a FOUP or a processing apparatus has been concerned.

In other words, the air atmosphere is likely to permit adhesion of moisture and oxygen to the surface of a wafer, causing corrosion and oxidation. Further, when a corrosive gas or the like used in the processing apparatus remains on the surface of a wafer, it may cause corrosion of a wiring material on the wafer surface and deterioration of yield. Further, a corrosion element accelerates a corrosion reaction, and when both moisture and corrosive gas are present, corrosion may develop faster.

In order to avoid such problems, it is conceivable to set the interior of the wafer transport chamber to a dry nitrogen atmosphere similar to the FOUP. Further, it is also conceivable to set a gas atmosphere by using an appropriate special gas, other than dry nitrogen, depending on the wafer processing contents.

In a conventional EFEM, an internal pressure has been increased to prevent ingress of particles from the outside, and it has scarcely been considered to suppress a gas flow to the outside from a wafer transport chamber and a load port constituting an EFEM. Thus, even if a special gas such as dry nitrogen is supplied to a wafer transport chamber, the gas flows to the outside, and it is difficult to properly maintain and manage the internal atmosphere. A large amount of gas is required, and the cost required for gas increases. Further, if a large amount of gas flows out of the EFEM, depending on the types of gas, the working environment outside the EFEM may be deteriorated.

Embodiments of the present invention have been made to solve efficiently the above problems. In particular, it is an object of the invention to provide a load port and EFEM, which suppress a gas flow to the outside and an air flow from the outside, when a wafer transport chamber constituting an EFEM is set in a special gas atmosphere, thereby reducing the supply amount of gas, and improving the quality of a wafer.

SUMMARY OF THE INVENTION

The present invention has taken the following measures in order to achieve the above object.

The load port according to an embodiment of the invention is a load port, being provided adjacent to a wafer transport chamber for taking in and out a wafer between the wafer transport chamber and a wafer storage container. The load port comprises a plate-shaped part that constitutes a part of a wall of the wafer transport chamber, and has an opening for opening the wafer transport chamber; a door part for opening and closing the opening; a mounting table that is configured to mount a wafer storage container so as to oppose a lid part for opening and closing an internal space of the wafer storage container to the door part, and to move to and from the plate-shaped part; and an elastic member that is provided on the mounting table side of the plate-shaped part along the peripheral edge of the opening, wherein the elastic member elastically contacts the periphery of the lid part in the wafer storage container by moving the mounting table to the plate-shaped part.

In such a configuration, when the wafer storage container moves to the plate-shaped part together with the mounting table, the opening of the plate-shaped part and the periphery of the lid part are connected through the elastic member, and even when the lid part of the wafer storage container and the door part of the plate-shaped part are opened, it is possible to prevent a flow of gas to the outside from the wafer transport chamber. Thus, when the interior of the wafer transport chamber is set to a special gas atmosphere, such as an inert gas, a clean gas, and a dry gas, it is possible to reduce the cost required for management of a gas by reducing the use amount of gas. It is also possible to suppress deterioration of the work environment outside the wafer transport chamber caused by the outflow of gas. Further, it is possible to suppress the inflow of gas to the wafer transport chamber from the outside, and it is also possible to prevent ingress of particles from the outside into the wafer storage container and wafer transport chamber. This maintains the quality of a wafer.

Even if particles are generated by the elastic contact of the elastic member, in order to increase the internal pressure of the wafer storage container to higher than the wafer transport chamber to prevent ingress of particles into the wafer storage container when the lid part and door part are opened, it is preferable to provide a gas supply means for supplying a gas to the wafer storage container through a gas supply value that is provided in the wafer storage container.

In order to enhance the adhesion between the wafer storage container and the elastic member, and increase the aforementioned effect, it is preferable to provide an engaging piece that is engageable with a flange part provided around the lid part, and a pulling means that pulls the engaging piece being engaged with the flange part toward the plate-shaped part.

In order to suppress an outflow of gas from the opening, and further save the gas regardless of the connection and non-connection of the wafer storage container, it is preferable to further provide an elastic member on the door part side of the plate-shaped part along the peripheral edge of the opening, wherein the elastic member provided on the door part side elastically contacts the door part, when the opening is closed by the door part.

In order to realize the above structure at a low cost, it is preferable to use an O-ring as the elastic member.

As a different structure from the above, it is preferable to form the elastic member in a plate shape.

In order to achieve a further reduction of manufacturing cost by decreasing the number of parts, it is preferable to integrally form the elastic member provided on the mounting table side and the elastic member provided on the door part side.

The EFEM of the embodiment of the invention is characterized by comprising one of the aforementioned load ports and a housing constituting the wafer transport chamber, wherein a seal member is provided between the housing and the plate-shaped part constituting the load port.

By configuring as above, it is possible to increase the airtightness of the wafer transport chamber, and suppress an outflow and inflow of gas to/from the outside. Thus, it is possible to easily manage the gas atmosphere in the wafer transport chamber, and reduce the cost required for management while maintaining a clean state.

In order to prevent adhesion of particles to a wafer during transport, when particles are generated by repeating the elastic contact of the elastic member, it is preferable to generate an air flow from the top downwards in the wafer transport chamber.

According to the embodiment of the invention described above, it is possible to provide a load port and EFEM, which suppress a gas flow to the outside and an air flow from the outside, when an EFEM is set in a special gas atmosphere, thereby reducing the supply amount of gas, and improving the quality of a wafer.

BRIEF DESCRIPTION OF THE DRAWINGS

FIG. 7 is a sectional side view of the load port.

MODES FOR CARRYING OUT THE INVENTION

Hereinafter, embodiments of the present invention will be described with reference to the drawings.

First Embodiment

Figure 1:
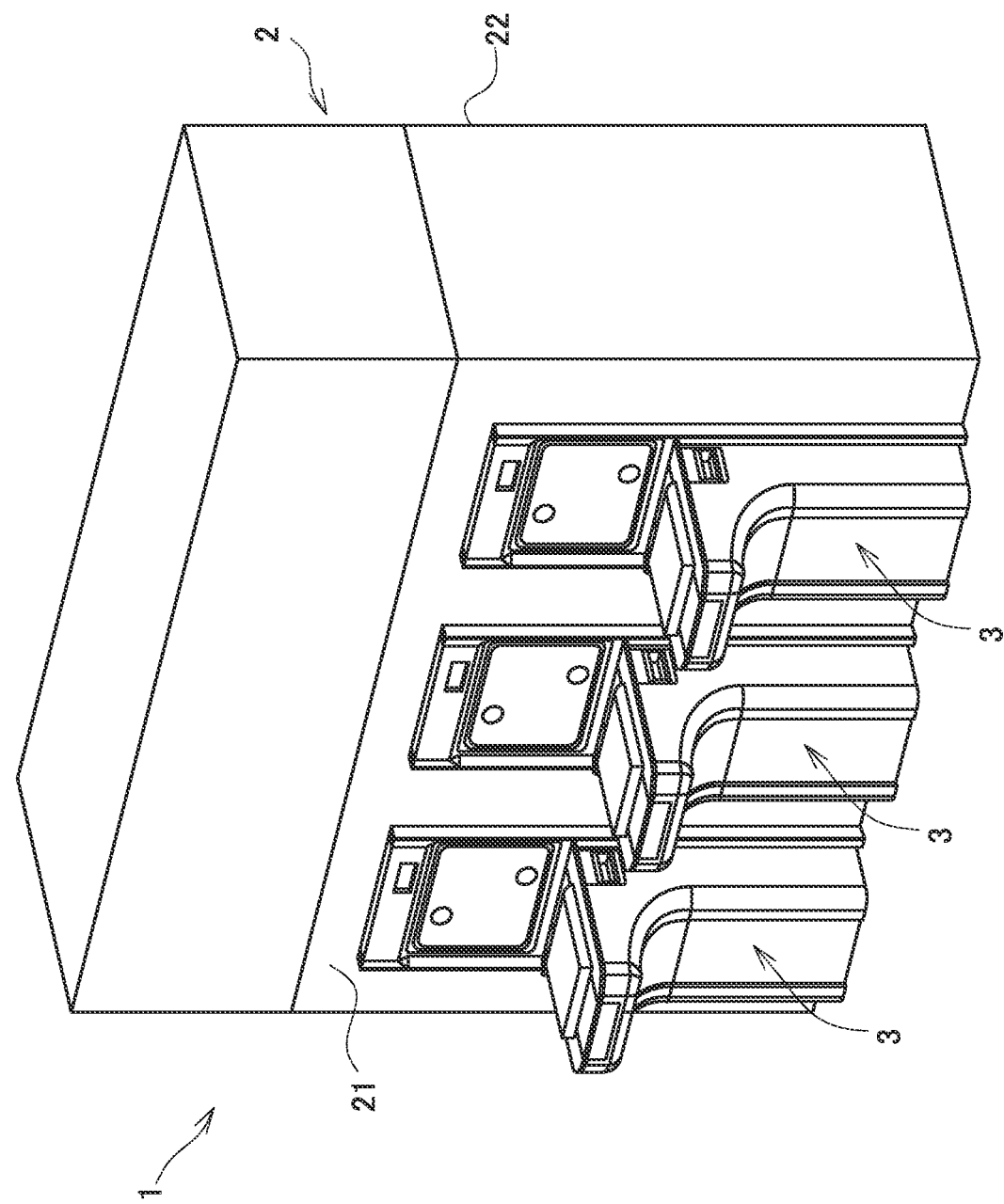
FIG. 1 is a perspective view of an EFEM provided with a load port according to a first embodiment of the present invention.

FIG. 1 shows an EFEM 1 provided with a load port 3 of the first embodiment, and an EFEM having the same. An EFEM 1 includes three load ports connected side by side on a front side 21 constituting a part of a wall of a wafer transport chamber 2 that constitutes a boxed-shaped housing.

In the present application, when viewed from a wafer transport chamber 2, a direction of the side connected to a load port 3 is defined as a front, a direction of a rear side 22 opposite to the front side 21 is defined as a rear, and a direction perpendicular to a longitudinal and vertical directions is defined as a side. In other words, three load ports 3 are arranged side by side on the side.

Figure 2:
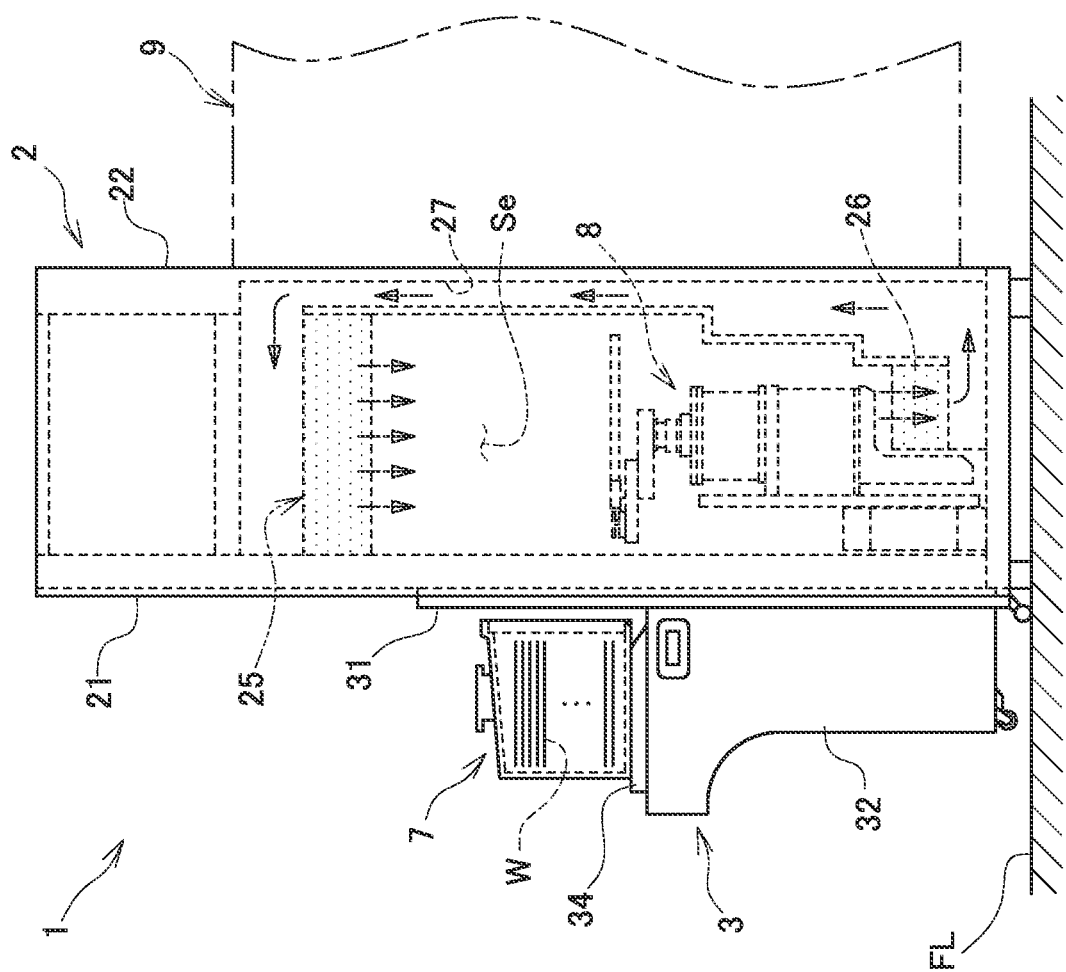
FIG. 2 is a side view of the EFEM.

FIG. 2 is a side view of the EFEM 1 provided with the load port 3. As described above, the load port 3 is connected to the front side 21 of the wafer transport chamber 2. The load port 3 is provided with a panel 31 as a plate-shaped part on the rear side. The panel 31 is integral with the front side 21, and constitutes a part of the wall of EFEM 1. In the load port 3, a mounting table 34 is provided so as to protrude to the front from the panel 31. On the mounting table 34, a FOUP 7 as a wafer storage container for storing a wafer can be mounted.

The EFEM 1 is installed on a floor FL. On the rear side 22 of the EFEM 1, a processing apparatus 9 for performing a predetermined process to a wafer W can be connected. Through a not-shown gate value provided on the rear side 22 of the EFEM 1, the internal space Se of the wafer transport chamber 2 is communicated with the processing apparatus 9. In the internal space Se of the wafer transport chamber 2, a wafer transport apparatus 8 for transporting a wafer W is provided. It is possible to transport a wafer W between the processing apparatus 9 and the FOUP 7 mounted on the load port 3 by using the wafer transport apparatus 8.

The wafer transport chamber 2 is configured to be substantially enclosed when connected to the load port 3 and the processing apparatus 9. It is possible to increase the concentration of nitrogen gas in the internal space Se by purging with a dry nitrogen gas through a not-shown gas supply port and gas discharge port. And, it is possible to send a gas downward by a fan filter unit 25 provided in the upper part of the wafer transport chamber 2, suck the gas through a chemical filter 26 provided in the lower part, and return the gas to the fan filter unit 25 in the upper part through a circulation duct 27 provided adjacent to the inside of the rear side 22. Thus, it is possible to form a down flow as an air stream directed downward from the top in the wafer transport chamber 2, and maintain a clean state by circulating the gas inside. Further, even when the particles contaminating the surface of a wafer W are present in the internal space Se of the wafer transport chamber 2, it is possible to suppress adhesion of the particles to the surface of the wafer W during transport by pushing down the particles by the downflow. It is also possible to capture the residual gas in the processing apparatus 9 by the chemical filter 26, and keep the internal space Se in a cleaner state.

Figure 3:
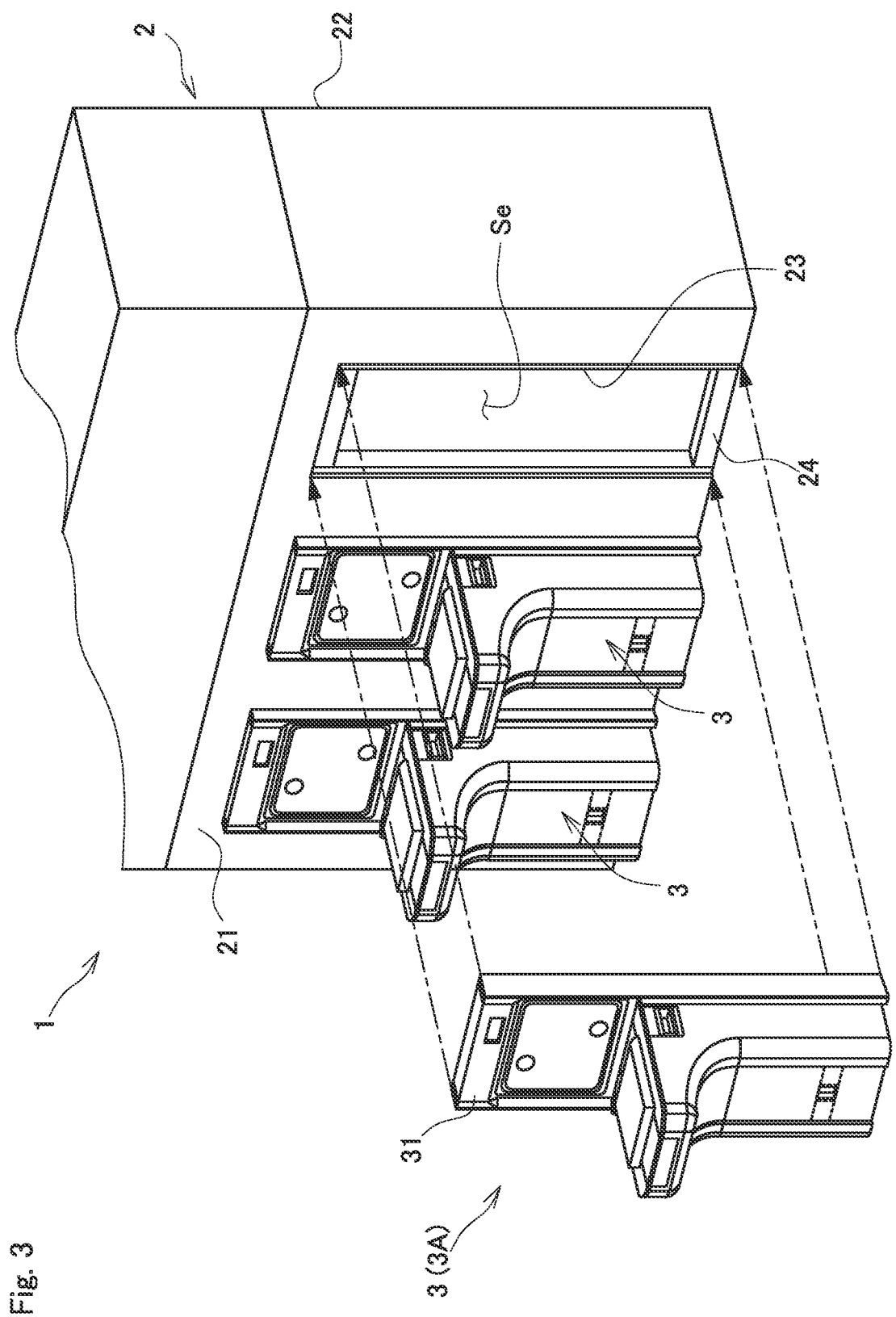
FIG. 3 is a perspective view of the EFEM with one of the load ports separated.

FIG. 3 shows the state that one load port 3A is removed from the wafer transport chamber 2 in the state of FIG. 1. On the front side 21 that connects the load port 3A, an opening 23 that is a little smaller than the panel 31 of the load port 3 is provided. The opening 23 opens the internal space Se. Along the peripheral edge of the opening 23, an abutment surface 24 is formed so as to form a step recessed backward. The rear side of the panel 31 abuts the abutment surface 24.

Figure 4:
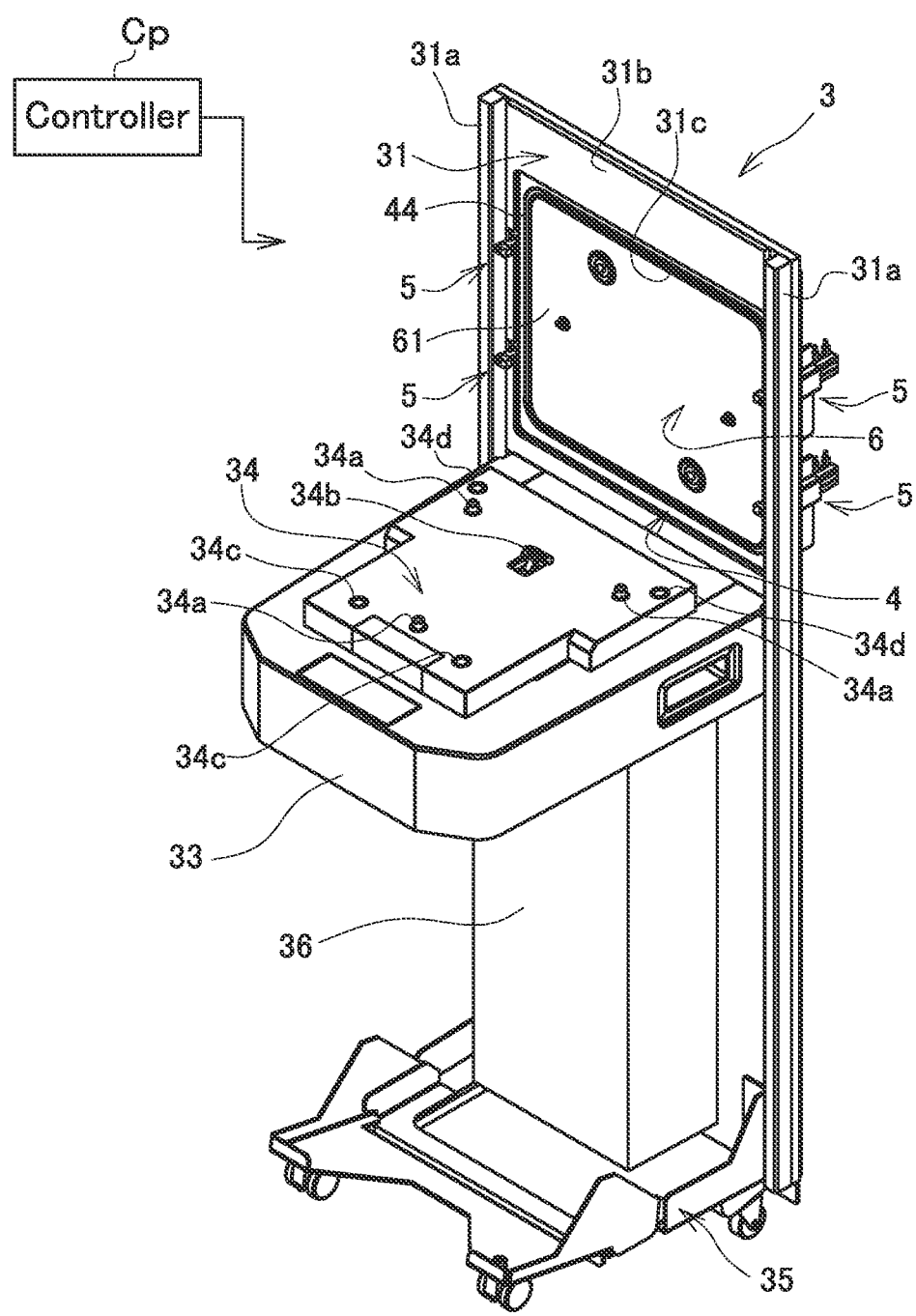
FIG. 4 is a perspective view of the load port.
Figure 5:
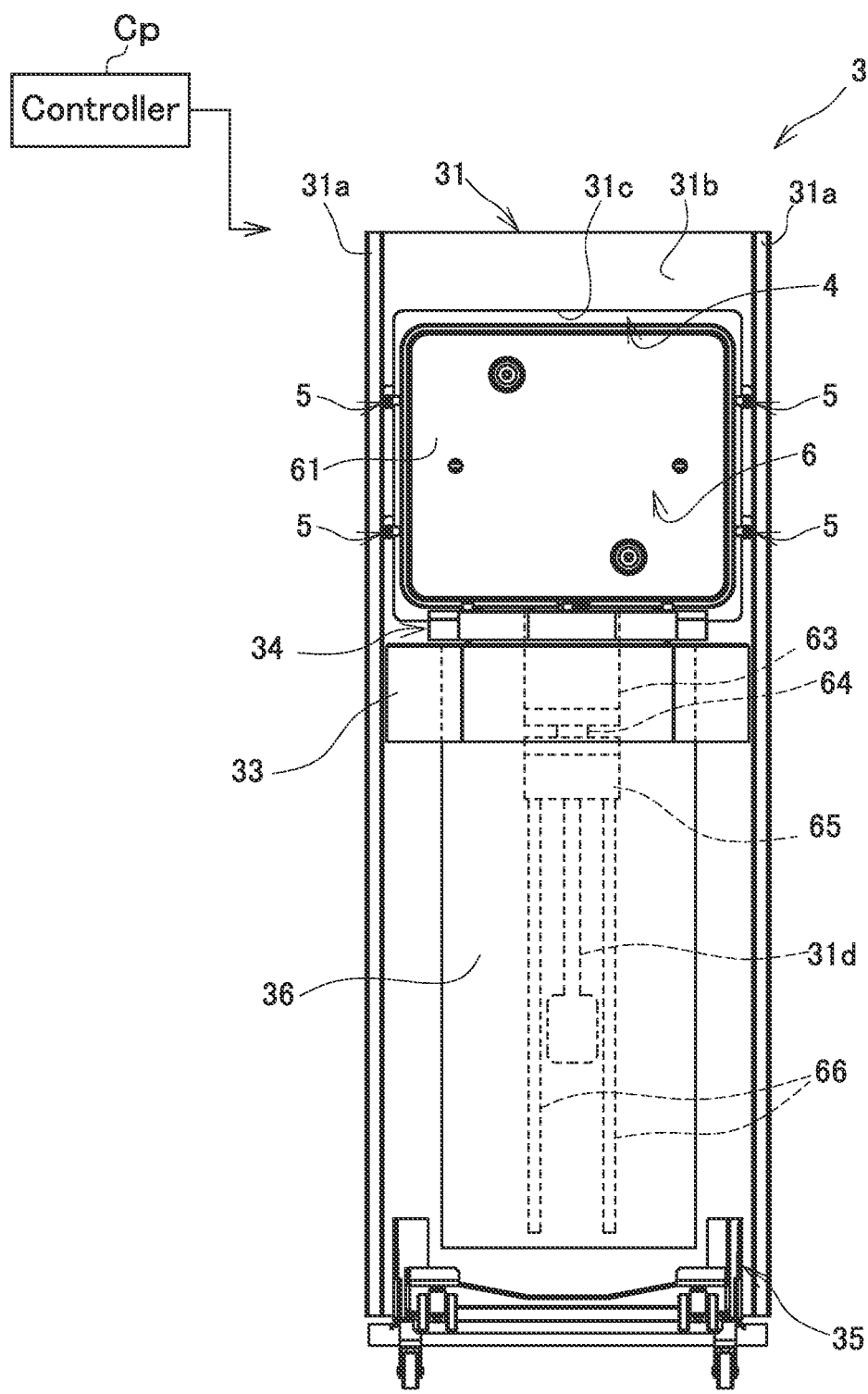
FIG. 5 is a front view of the load port.
Figure 6:
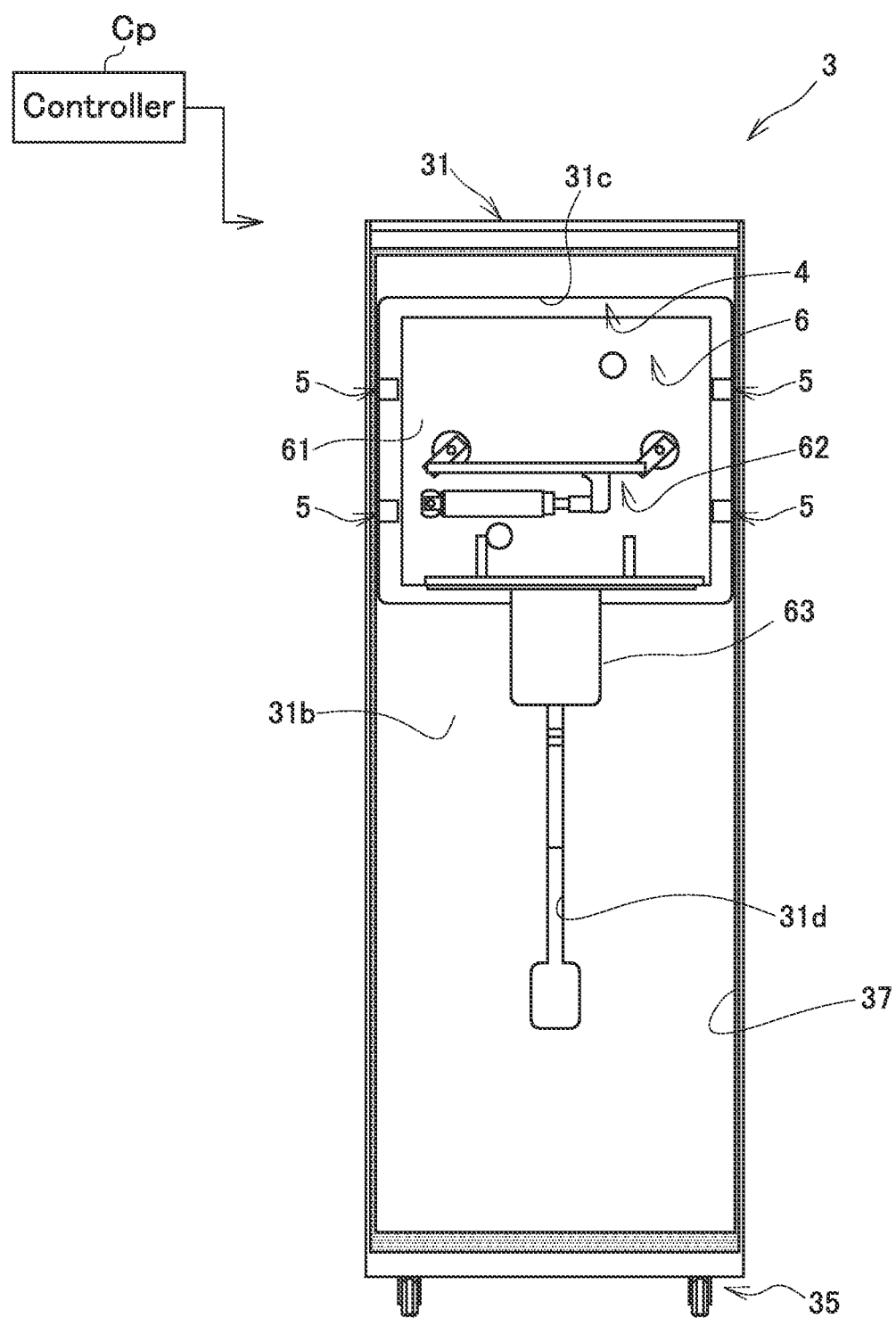
FIG. 6 is a rear view of the load port.

FIGS. 4, 5, and 6 are a perspective view of the load port 3, a front view seen from the front, and a rear view seen from the rear, respectively. Hereinafter, the configuration of the load port 3 will be described with reference to these diagrams. In these diagrams, an external cover 32 (refer to FIG. 2) located below the mounting table 34 is removed to expose a part of the internal structure.

Figure 7:
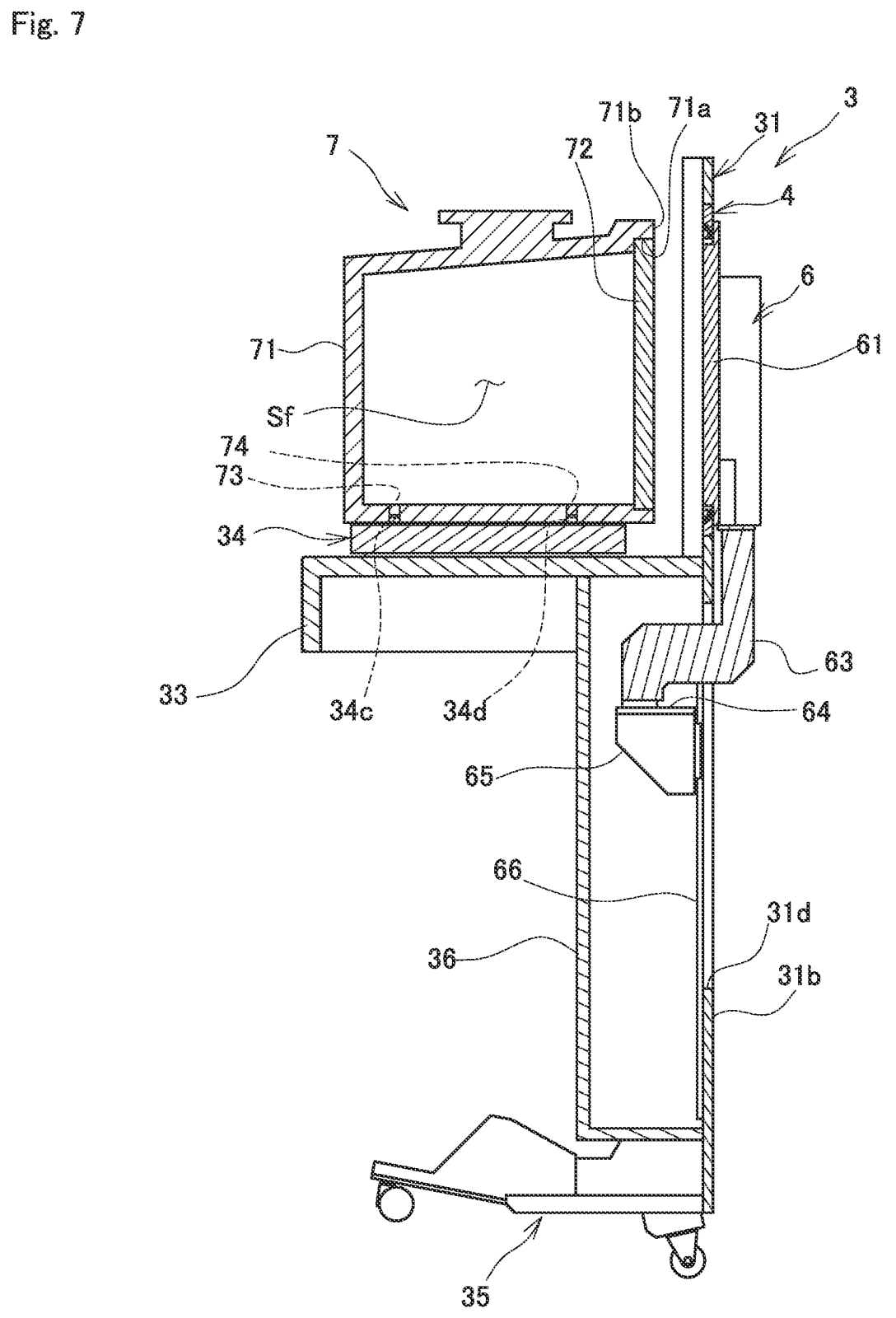

In the load port 3, the panel 31 stands vertically from the rear of the leg portion 35 to be attached with a caster and an installation leg, and a horizontal base 33 is provided to the front from the height of approximately 60% of the panel 31. On the horizontal base 33, the mounting table 34 for mounting the FOUP 7 (refer to FIG. 2) is provided. The FOUP 7 is, as schematically shown in FIG. 7, configured with a main body 71 having an internal space Sf for storing a wafer W (refer to FIG. 2), and a lid part 72 that can close the opening 71a provided on one side of the main body 71 so as to be an inlet/outlet of a wafer W. When the FOUP 7 is correctly mounted on the mounting table 34, the lid part 72 is faced to the panel 31.

Returning to FIGS. 4 to 6, on the mounting table 34, a positioning pin 34a for positioning the FOUP 7 is provided, and a lock claw 34b for fixing the FOUP 7 to the mounting table 34 is provided. By performing a locking operation, the lock claw 34b can guide and lock the FOUP 7 to/at a proper position by cooperating with the positioning pin 34a. By performing an unlocking operation, the lock claw 34b can separate the FOUP 7 from the mounting table 34.

Further, on the mounting table 34, a gas supply nozzle 34c that constitutes a gas supply means for supplying a gas to the FOUP 7 (refer to FIG. 2), and a gas discharge nozzle 34d constituting a gas discharge means for discharging a gas from the FOUP 7 are provided at two locations, respectively. They are usually located below the top of the mounting table 34, and moved upward when used, and connected to the gas supply valve 73 and the gas discharge valve 74 (refer to FIG. 7), respectively provided in the FOUP 7. It is possible to perform a gas purge by supplying a gas such as a dry nitrogen gas to the internal space Sf of FOUP 7 (refer to FIG. 7) from the gas supply nozzle 34c through the gas supply valve 73, and discharging the gas in the internal space Sf from the gas discharge nozzle 34 through the gas discharge valve 74. It is also possible to set a positive pressure, that the pressure in the internal space Sf is higher than the external pressure and the pressure in the internal space Se of the wafer transport chamber 2 (refer to FIG. 2), by increasing the gas supply amount to more than the gas discharge amount.

The mounting table 34 is movable in the longitudinal direction with the FOUP 2 (refer to FIG. 7) mounted thereon.

The panel 31 constituting the load port 3 comprises a column 31a standing on both sides, a panel main body 31b supported by them, a window unit 4 that is attached to a window portion 31c opened in a substantially rectangular shape in the panel main body 31. The substantially rectangular shape mentioned in the present application is a rectangle having four sides with four corners smoothly connected by an arc. In the vicinity of the outer periphery of the rear side of the panel main body 31b, a gasket 37 as an elastic member formed in a rectangular frame shape is provided. The gasket 37 is made of a rubber material with a less transmission of gas. The gasket 37 is configured to abut the abutment surface 24 (refer to FIG. 3) set close to the edge of the opening 23 of the wafer transport chamber 2, eliminates a gap between the outer periphery of the panel main body 31b and the opening 23, and suppresses a gas leakage to the outside from the wafer transport chamber 2.

The window unit 4 is provided at a position opposite to the lid part 72 (refer to FIG. 7) of the FOUP 7. As described in detail later, a substantially rectangular opening 42 (refer to FIG. 7) is provided, and it is possible to open the internal space Se of the wafer transport chamber 2 through the opening 42. The load port 3 is provided with an opening/closing mechanism 6 for opening and closing the opening 42.

The opening/closing mechanism 6 comprises a door part 61 for opening and closing the opening 42, a support frame 63 for supporting the door part, a movable block 65 that supports the support frame 63 movable in the longitudinal direction through a slide support means 64, and a slide rail 66 that supports the movable block 65 in the vertical direction with respect to the panel main body 31b. The support frame 63 is configured to support the rear lower part of the door part 61 as shown in FIG. 7, and formed in a substantially crank-like shape, extending downward, passing through a slit-shaped insertion hole 31d provided in the panel main body 31b, and protruding ahead of the panel main body 31b. The slide support means 64 for supporting the support frame 63, the movable block 65, and the slide rail 66 are provided in front of the main body 31b. In other words, a sliding part of moving the door part 61 is located outside the wafer transport chamber 2, and the insertion hole 31d is made small like a slit, even if particles occur in these parts, it is possible to suppress ingress of the particles into the wafer transport chamber 2.

Further, an actuator (not shown) for moving the door part 61 in the longitudinal and vertical directions is provided in each direction. By giving them a driving instruction from a controller Cp, it is possible to move the door part 61 in the longitudinal and vertical directions.

In front of the panel main body 31b, a cover 36 that extends downward from directly under the horizontal base 33 is provided so as to cover and enclose the support frame 63, the slide support means 64, the movable block 65, and the slide rail 66 inside the cover 36. Thus, although the insertion hole 32d is formed in the panel main body 31b, the gas in the wafer transport chamber 2 (refer to FIG. 3) does not flow out through the insertion hole.

The door part 61 comprises a connecting means for latch operation for opening and closing a lid part 72 (refer to FIG. 7) of the FOUP 7, and for holding the lid part 72. The connecting means 62 is able to make the lid part 72 openable by performing the latch operation to the lid part 72, and connect the lid part 72 to the door part 61 to integrate them. On the contrary, it is possible to release the connection of the door part and the lid part 72, and attach the lid part 72 to the main body 71 to a closed state.

Here, a detailed configuration of a window unit 4 will be described with reference to FIG. 11. The window unit 4 comprises a window frame part 41, O-rings 44 and 46 (refer to FIG. 12) as an elastic member to be attached to the window frame part, and a clamp unit 5 as a pulling means for closely fitting the FOUP 7 (refer to FIG. 7) to the window frame part 41 through the O-ring 44.

The window frame part 41 is formed in a frame shape with a substantially rectangular opening 42 formed inside. The window frame part 41 constitutes a part of the panel 31 (refer to FIG. 3) as a constituent element of the window unit 4, and the opening 42 opens the front side 21 as a wall of a housing constituting the wafer transport chamber 2. The opening 42 is slightly larger than the outer periphery of the lid part 72 (refer to FIG. 7) of the FOUP 7, and the lid part 72 is movable through the opening 42. In the state that the FOUP 7 is mounted on the mounting table 34, the front side of the main body 71 forming the periphery of the lid part 72 as an abutment surface 71b abuts the window frame part 41 through the O-ring 44.

Figure 12:
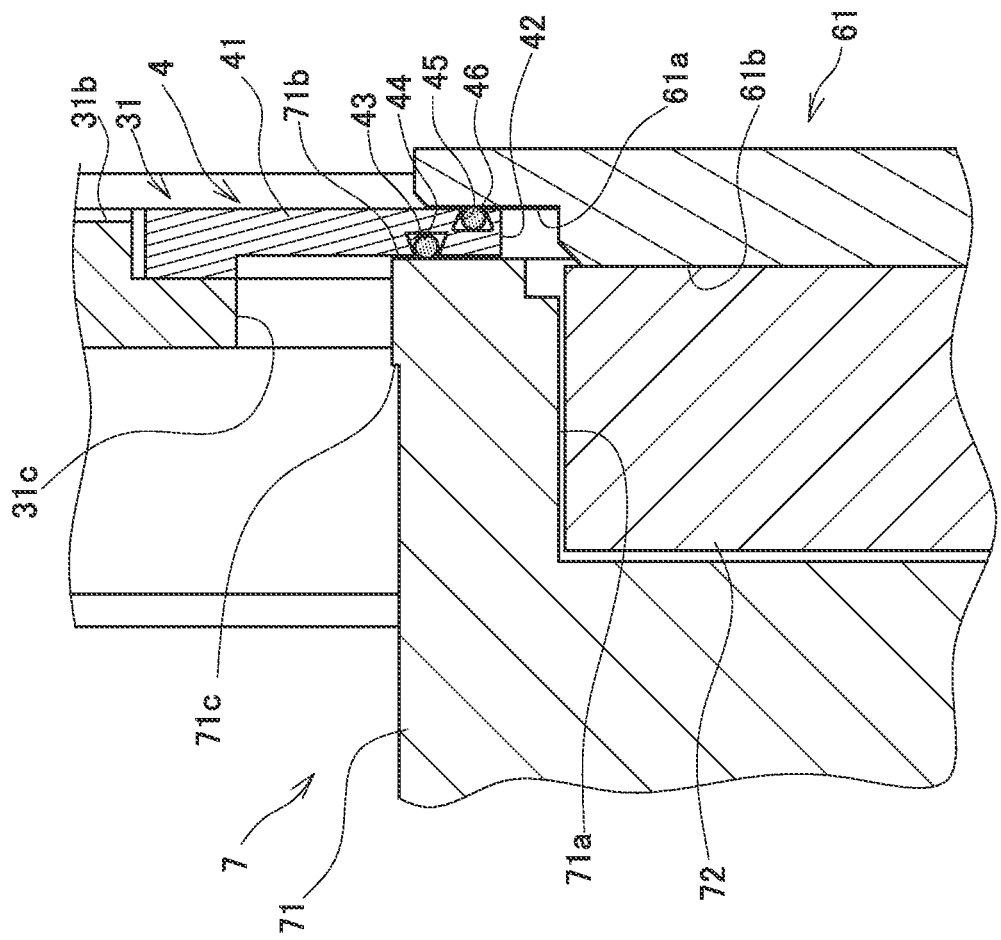
FIG. 12 is an enlarged sectional view an essential part showing an enlarged A-A cross section in FIG. 11.

The door part 61 abuts the rear side of the window frame part 41 through the O-ring 46 (refer to FIG. 12). In particular, a thin portion 61a provided like a flange on the outer periphery of the door part 61 abuts there. At this time, a thick portion 61b formed inside the thin portion 61a is formed smaller than the opening 42, and protruded to the front through the opening 42.

Figure 11:
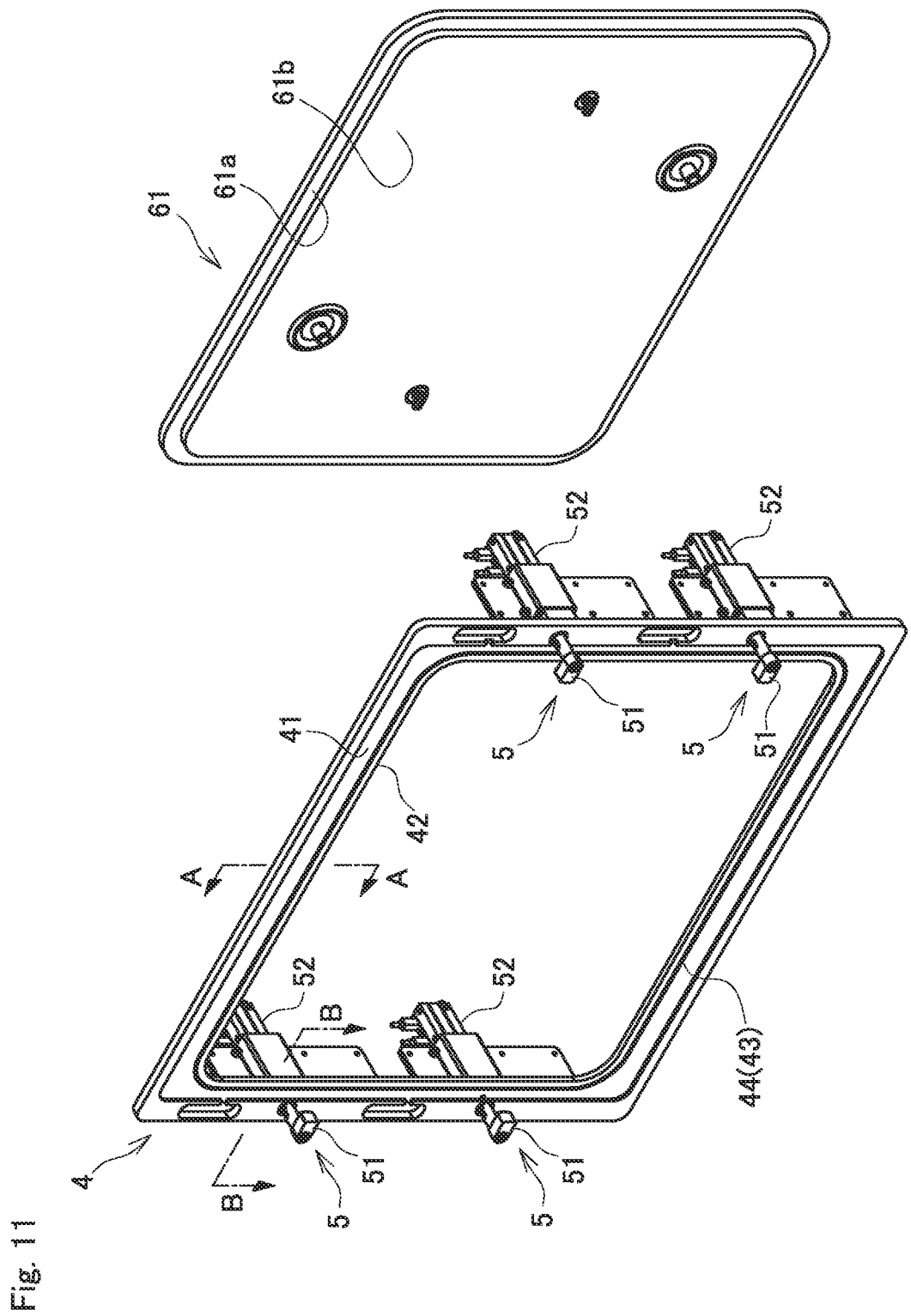
FIG. 11 is an enlarged perspective view showing an enlarged window unit and a door part constituting the load port.

FIG. 12 shows an enlarged A-A cross section in FIG. 11. On the front side of the window frame part 41, a dovetail groove 43 is formed to have a trapezoidal cross section so as to move around the vicinity of the peripheral edge of the opening 42, and the O-ring 44 is inserted therein. The dovetail groove 43 is small in an opening, and formed to have a cross section spreading toward the inside, and it is possible to properly support the O-ring 44 inside. Thus, the O-ring 44 does not easily pop out. Further, a part of the O-ring 44 protrudes toward the front from the opening of the dovetail groove 43. The protruded part can abut the abutment surface 71b set in the FOUP 7. Therefore, when the FOUP 7 mounted on the mounting table 34 (refer to FIG. 7) moves to the panel 31 together with the mounting table 34, the O-ring 44 can elastically contact the abutment surface.

Similarly, on the rear side of the window frame part 41, a dovetail groove 45 is formed to have a trapezoidal cross section so as to move around the vicinity of the peripheral edge of the opening 42, and the O-ring 44 is inserted therein. When the door part 61 closes, the O-ring elastically contacts the thin portion 61a of the outer periphery. The dovetail groove 45 is formed inside the dovetail groove 43, so that the thickness of the both does not become extremely thin and the strength does not become insufficient.

Returning to FIG. 11, the clamp unit 5 is provided in total four locations arranged apart in the vertical direction on both sides of the window frame part 41. Each clamp unit 5 generally comprises an engaging piece 51, and a cylinder 52 for operating it.

Figure 13:
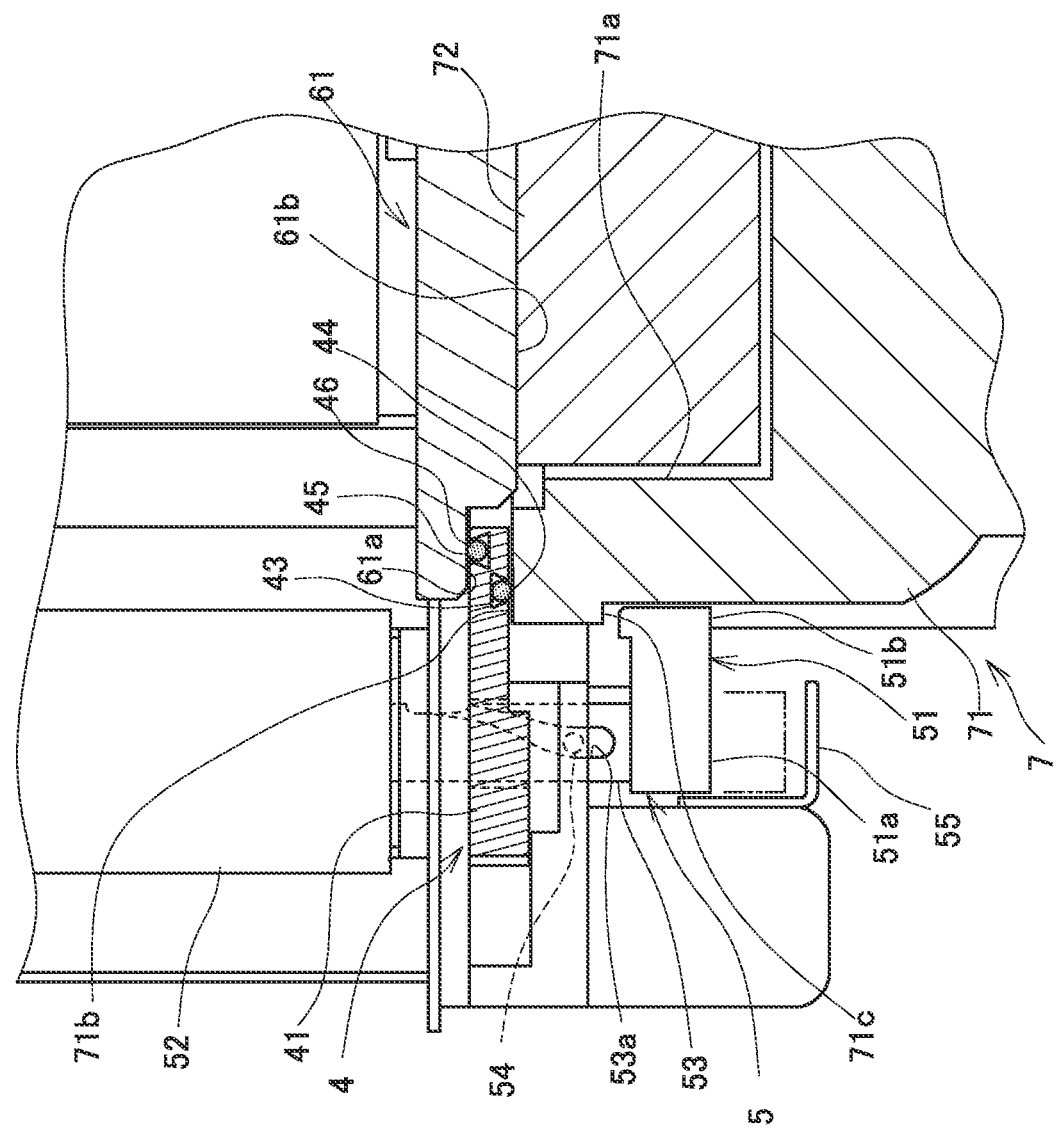
FIG. 13 is an enlarged perspective view of an essential part showing an enlarged B-B cross section in FIG. 11.
Figure 14:
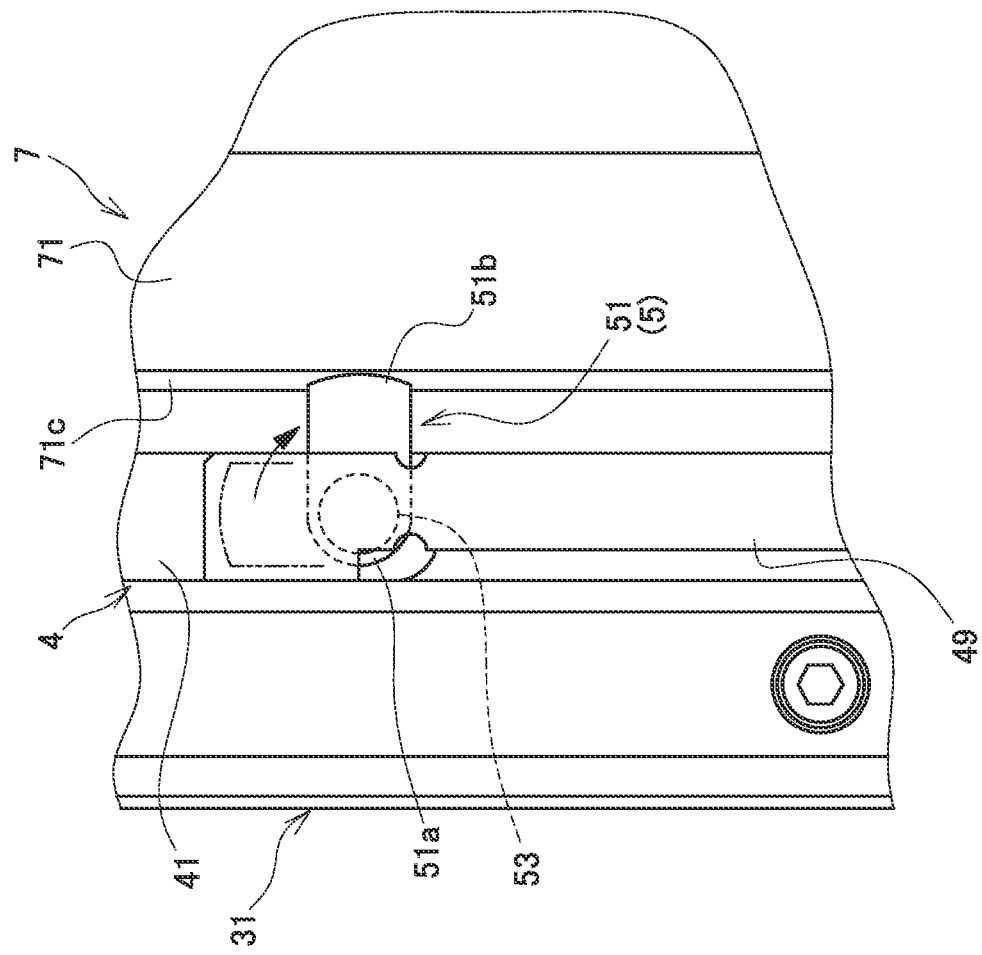
FIG. 14 is an enlarged perspective view of an essential part showing a clamp unit provided in the window unit.

FIG. 13 shows an enlarged B-B cross section in FIG. 11. A cylinder 52 constituting the clamp unit 5 is attached in the rear of the window frame part 41, and provided with a shaft 53 that is movable toward the front through a hole provided in the window frame part 41. At the distal end of the shaft 53, a proximal end 51a of the engaging piece 51 is attached, so that the distal end 51b extends toward the outer circumferential direction from the proximal end 51a. On the outer periphery of the shaft 53, a guide groove 53a is formed with a phase twisted 90° along the axial direction. In the guide groove, a guide pin 54 fixed to the window frame part 41 is inserted from a radial direction. Thus, the guide groove 53a is guided by the guide pin 54 along with the back and forth movement of the cylinder 52, and the shaft 53 rotates 90° around the axial center. And, as shown in FIG. 13b, when the engaging piece 51 pups out forward together with the shaft 51, the distal end 51b faces upward. When the engaging piece is pulled rearward, the distal end 51b faces the direction toward the FOUP 7 inside. When the distal end 51b faces inside, the engaging piece 51 can engage with the flange part 71c that protrudes sideways from the FOUP 7. When the shaft 53 is further pulled by the cylinder 52 while keeping the engaged state, as shown in FIG. 12, it is possible to adhere the abutment surface 71b of the FOUP 7 more closely to the O-ring 44 to a clamped state. As the clamp unit 5 works at four locations, it is possible to uniform the amount of deformation of the O-ring 44, and enhance the sealing property. When the engaging piece 51 moves forward, the distal end 51b faces upward, and becomes to a position not interfering with the flange part 71c as viewed from the front. By doing so, it is possible to move the FOUP 7 together with the mounting table (refer to FIG. 7). When the distal end 51b moves forward, it is merely sufficient so as not to interfere with the flange part 71c. The distal end 51b may be set downward or outward, not only upward.

In front of the engaging piece 51, a cable guide 55 extending in the vertical direction is provided. The cable guide 55 is formed by bending a steel metal, and prevents the other members from being involved in the engaging piece 51. Piping, electrical wiring and the like are preferably fixed outside the cable guide 55.

The load port 3 configured as above is operated when a driving instruction is given to each part by the controller Cp shown in FIG. 4. Hereinafter, an operation example of this embodiment when using the load port 3 will be described with reference to FIGS. 7 to 10.

FIG. 7 shows the state that the FOUP 7 is mounted on the mounting table 34, and separated from the panel 31. In this state, as the door part 61 abuts the rear side of the window frame part 41 constituting the window unit 4 (refer to FIG. 12) through the O-ring 46, no gap occurs between the window frame part 41 and the door part 61, providing high sealing properties. Thus, even when the internal space Sf of the wafer transport chamber 2 has been filled with a nitrogen gas or the like, it is possible to suppress a gas outflow to the outside and an inflow to the internal space Sf from the outside.

Although omitted in this diagram, the FOUP 7 is located and fixed at an appropriate position with respect to the mounting table 34 by the locking operation of the lock claw 53 (refer to FIG. 4) and the positioning action of the positioning pin 34.

The gas supply nozzle 34c and gas discharge nozzle 34d provided in the mounting table 34 is protruded upward, and connected to the gas supply valve 73 and gas discharge valve 74 respectively provided in the FOUP 7. Thereafter, a fresh, dry nitrogen gas is supplied through the gas supply nozzle 34c and gas supply valve 73, and the gas stayed in the internal space Sf is discharged from the gas supply nozzle 34c through the gas discharge valve 74. By performing a gas purge in this way, the internal space Sf is filled with a nitrogen gas, and the wafer transport chamber 2 is kept in a higher pressure state than the internal space Sf.

Figure 8:
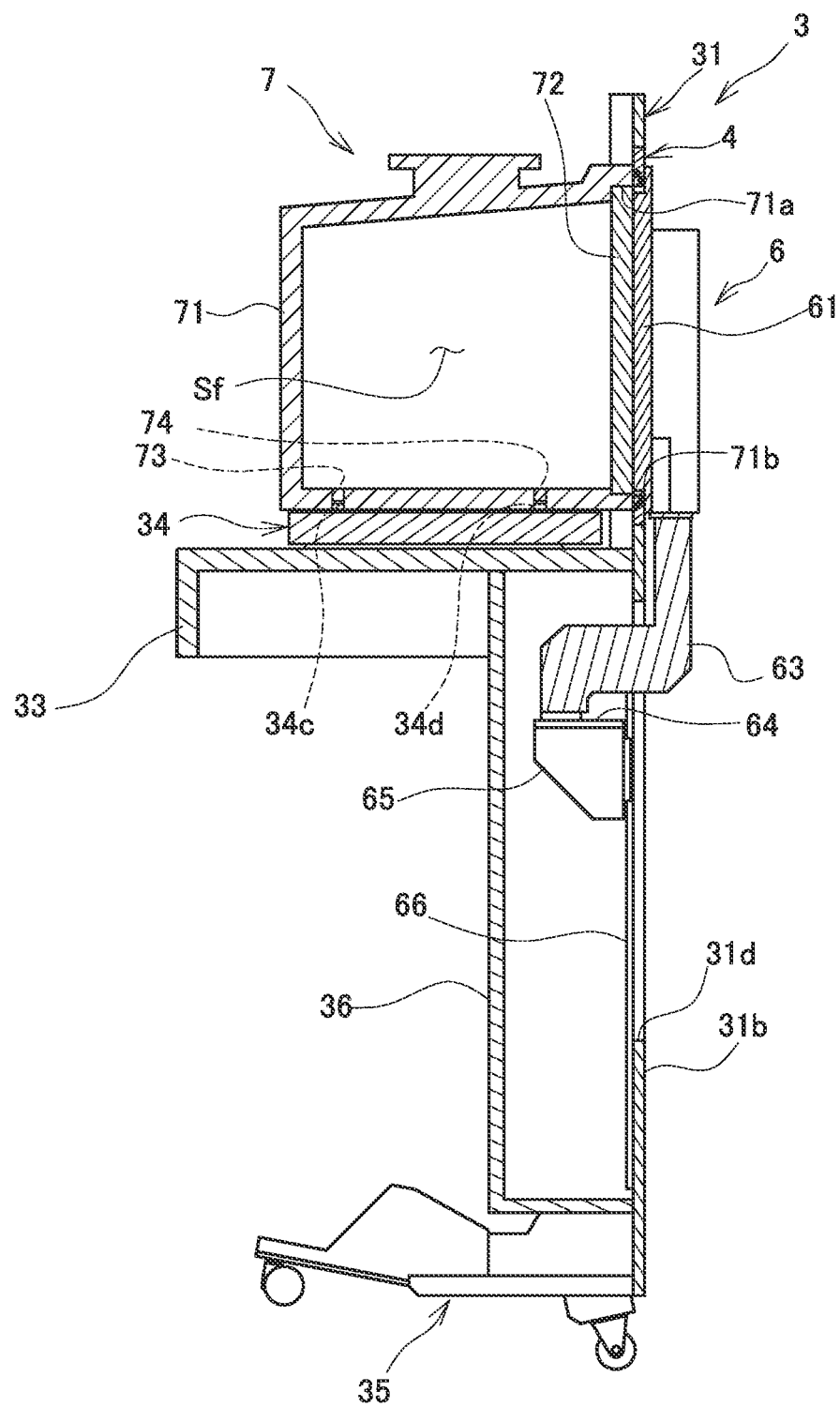
FIG. 8 is a sectional side view of the state of FIG. 7 with a FOUP moved to a plate-shaped part.

Next, as shown in FIG. 8, move the mounting table 34 rearward, and the abutment surface 71b of the FOUP 7 abuts the window frame part 41. In particular, the abutment surface 71b abuts the window fame part through the O-ring 44 provided in the front of the window frame part 41 (refer to FIG. 12), thereby making an airtight state. When moving the mounting table 34 in this way, previously project the engaging piece 51 (refer to FIG. 13) by the cylinder 52 constituting the clamp unit 5 not to interfere with the FOUP with the distal end 51b faced upward.

Further, by operating the connecting means 62 provided in the door part 61 (refer to FIG. 6), it is possible to unlatch the lid part 72 to be removable from the main body 71, and temporary hold the lid part 72 by the door part 61. At the same time, the cylinder 52 constituting the clamp unit 5 pulls the engaging piece 51 (refer to FIG. 13) rearward, engages it with the flange part 71c of the FOUP 7 with the distal end 51b faced inside. By pulling further the engaging piece, the abutment surface 71b of the FOUP 7 adheres closer to the O-ring 44, enhancing the sealing property.

Figure 9:
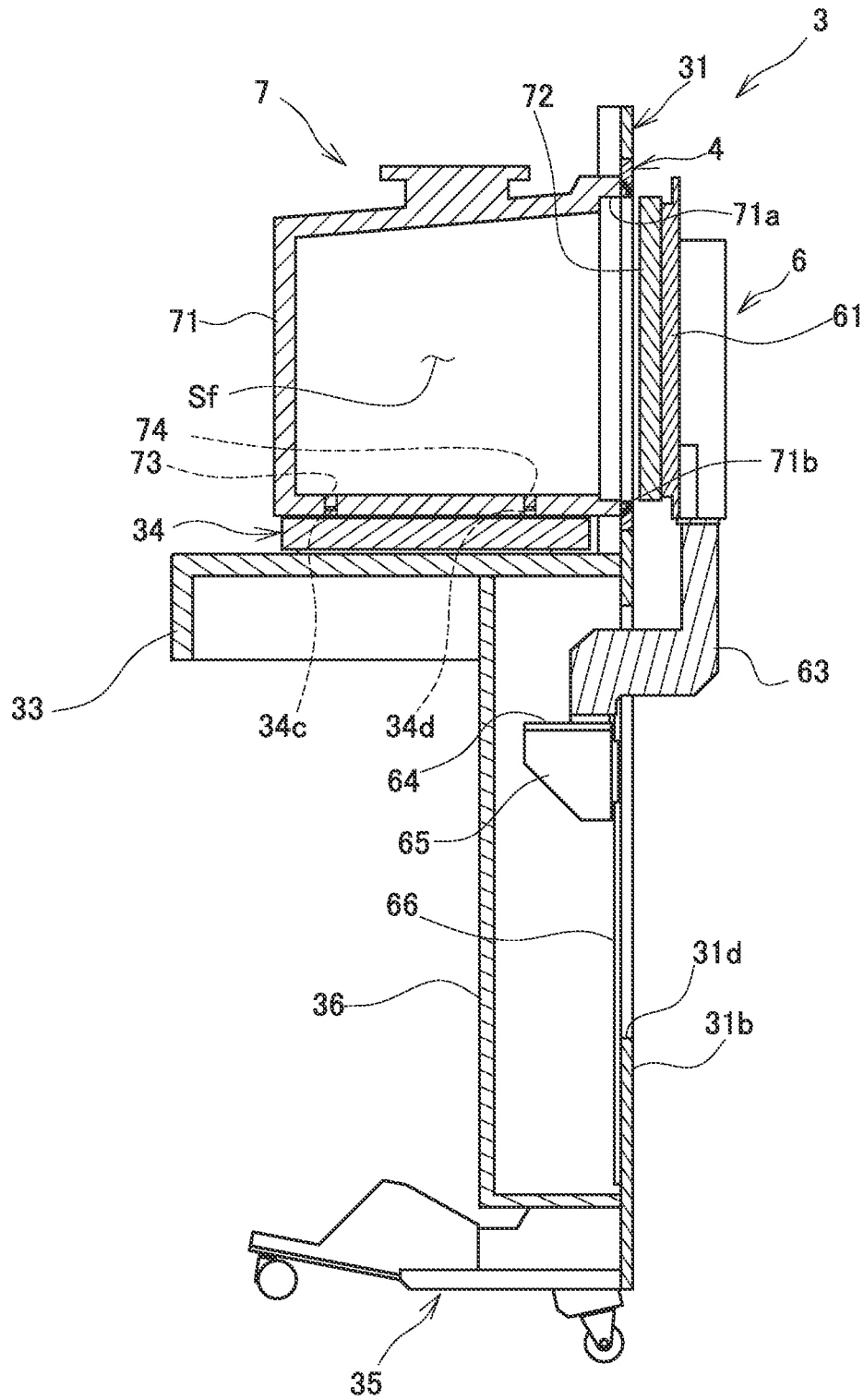
FIG. 9 is a sectional side view of the state of FIG. 8 with a door part and a lid part of the FOUP separated from the plate-shaped part.
Figure 10:
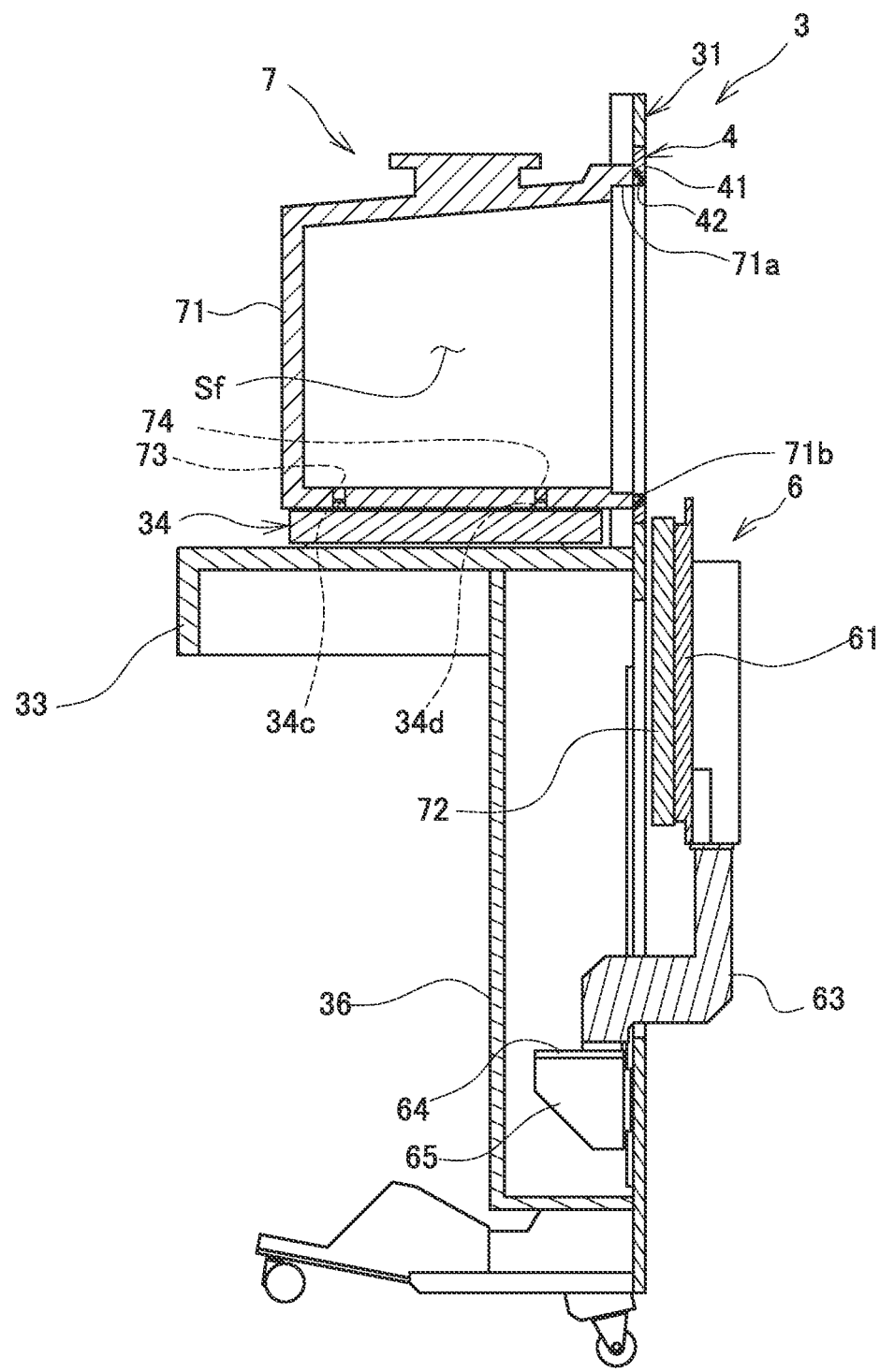
FIG. 10 is a sectional side view of the state of FIG. 9 with a door part and a lid part of the FOUP moved downward.

In this state, as shown in FIG. 9, move the door part 61 rearward together with the support frame 63. By doing so, it is possible to separate the lid part 72 of the FOUP 7 from the main body 71, and open the internal space Sf. At this time, as the abutment surface 71b of the FOUP 7 closely adheres to the window unit 4, it is possible to suppress an outflow and inflow of the gas between the outside and the wafer transport chamber 2 and FOUP 7.

Further, as the FOUP 7 has been set to a high pressure state, a gas flows toward the wafer transport chamber 2 from the internal space Sf of the FOUP 7. Thus, it is possible to suppress ingress of particles or the like into the FOUP 7 from the wafer transport chamber 2, and maintain the interior of FOUP 7 clean. It is also preferable to continuously supply a gas at a low flow rate through the gas supply nozzle 34c in order to prevent the ingress of particles.

Next, move the door part 61 upward together with the support frame 63. By doing so, the rear of the opening 71a can be widely opened, and a wafer W can be moved between the FOUP 7 and the processing apparatus 9 (refer to FIG. 2). Since the entire mechanism for moving the door part 61 is covered with the cover 36, it is possible to suppress leakage of the gas in the wafer transport chamber 2 to the outside.

The opening 71a of the FOUP 7 is opened as described above. When closing the opening 71a of the FOUP 7, do the reverse operation.

By repeating such operations, the O-rings 44 and 46 repeat the elastic contact with the lid part 72 or the door part 61, and new particles may occur. Such particles are moved downward by a down flow generated inside the wafer transport chamber 2, when the lid part 72 or the door part 61 are opened (refer to FIG. 2). Thus, the particles do not adhere to the surface of a wafer W, and the surface of the wafer W can be kept clean.

As described above, the load port 3 in this embodiment is a unit that is provided adjacent to the wafer transport chamber 2, and used for taking in and out of a wafer between the wafer transport chamber 2 and the FOUP 7 as a wafer storage container. The load port 3 comprises a panel 31 as a plate-shaped part that constitutes a part of a wall of the wafer transport chamber 2, and has an opening for opening the wafer transport chamber 2; a door part 61 for opening and closing the opening 42; a mounting table 34 that is configured to mount a FOUP 7 so as to oppose a lid part 72 for opening and closing an internal space to the door part 61, and to move to and from the panel 31; and an O-ring 44 as an elastic member that is provided on the mounting table 34 side of the panel 31 along the peripheral edge of the opening 42, wherein the O-ring 44 elastically contacts an abutment surface 71b forming the periphery of the lid part 72 by moving the mounting table 34 to the panel 31.

In such a configuration, when the FOUP 7 moves to the panel 31 together with the mounting table 34, the opening 42 of the panel 31 and the periphery of the lid part 72 are connected through the O-ring 44, and even when the lid part 72 of the FOUP 7 and the door part 61 of the panel 31 are opened, it is possible to prevent an outflow of gas to the outside from the wafer transport chamber 2. Thus, when the interior of the wafer transport chamber 2 is set in an atmosphere of special gas such as an inert gas, a clean gas, and a dry gas, it is possible to reduce the cost required for management of a gas by reducing the use amount of the gas. It is also possible to suppress deterioration of the work environment outside the wafer transport chamber 2 caused by the outflow of gas. Further, it is possible to suppress the inflow of gas from the outside to the FOUP 7 and wafer transport chamber 2, and it is also possible to prevent ingress of particles from the outside into the FOUP 7 and wafer transport chamber 2. This maintains the quality of a wafer.

Being provided with the gas supply nozzle 34c as a gas supply means for supplying a gas to the FOUP 7 through the gas supply valve 73 provided in the FOUP 7, even when particles occur along with the elastic contact of the O-ring 44, if the pressure in the FOUP 7 is increased to higher than that in the wafer transport chamber 2 by using the gas supply nozzle 34c, the gas flows out to the wafer transport chamber 2 from the FOUP 7 along with the opening of the lid part 72 and door part 61. Thus, it is possible to prevent ingress of the particles into the FOUP 7, and maintain a clean state.

Further, being provided with the engaging piece 51 that is engageable with the flange part 71c provided on the periphery of the lid part 72, and the clamp unit 5 as a pulling means for pulling the engaging piece 51 toward the panel 31 being engaged with the flange part 71c, the clamp unit 5 pulls the engaging piece 51 toward the panel 31 being engaged with the flange part 71c of the FOUP 7 along with the movement of the mounting table 34. Thus, it is possible to further enhance the above-mentioned effects by increasing the adhesion between the FOUP 7 and O-ring 44.

Further, being provided with the O-ring 46 as an elastic member that is provided in the door part 61 of the panel 31 along the peripheral edge of the opening 42, when the door part 61 closes the opening 42, the O-ring 46 provided in the door part 61 elastically contacts the door part 61. Thus, when the door part 61 closes the opening 42, an outflow of gas from the opening 42 can be suppressed, regardless of the connection and disconnection of the FOUP 7, by elastically connecting the O-ring 46 of the door part 61 to the door part 61. Thus, it is possible to further save the gas.

Further, since the elastic members for sealing are the O-rings 44 and 46, it is possible to configure a sealing structure at a low cost.

The EFEM 1 in this embodiment comprises the load port 3, and the housing 2 constituting a wafer transport chamber. A gasket 37 as a sealing member is provided between the panel 31 constituting the load port 3 and the housing 2. Thus, it is possible to enhance the airtightness in the water transport chamber 2, and suppress an outflow and inflow of gas to/from the outside. It is also possible to easily manage the gas atmosphere in the wafer transport chamber 2, and reduce the cost required for the management while maintaining a clean state.

In addition, an airflow from the top downwards is generated in the wafer transport chamber 2, and even when particles occur, it is possible to move the particles downward by the downward airflow by the elastic contact of the O-rings 44 and 46 as an elastic member, immediately after the door part 61 and lid part 72 open, and prevent the adhesion of the particles to the wafer W to be transported.

Second Embodiment

Figure 15:
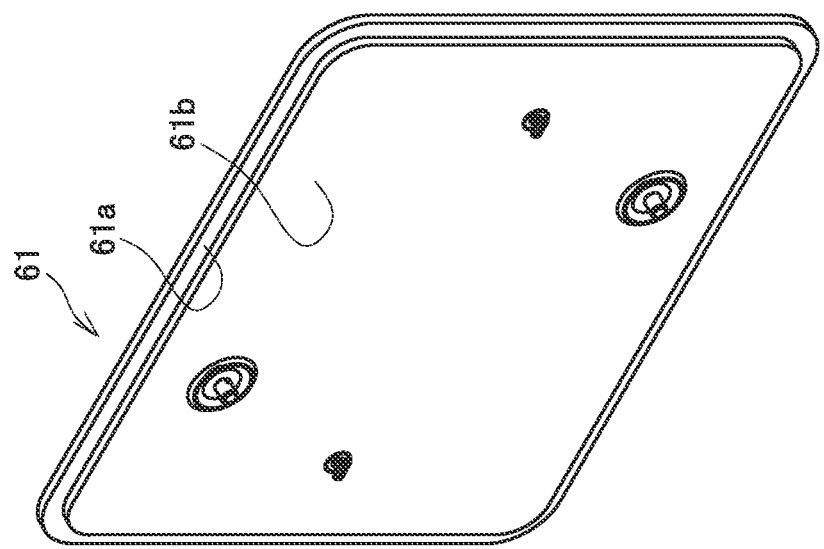
FIG. 15 is an enlarged perspective view of an essential part showing a window unit and a door part constituting a load port according to a second embodiment of the invention.
Figure 15:
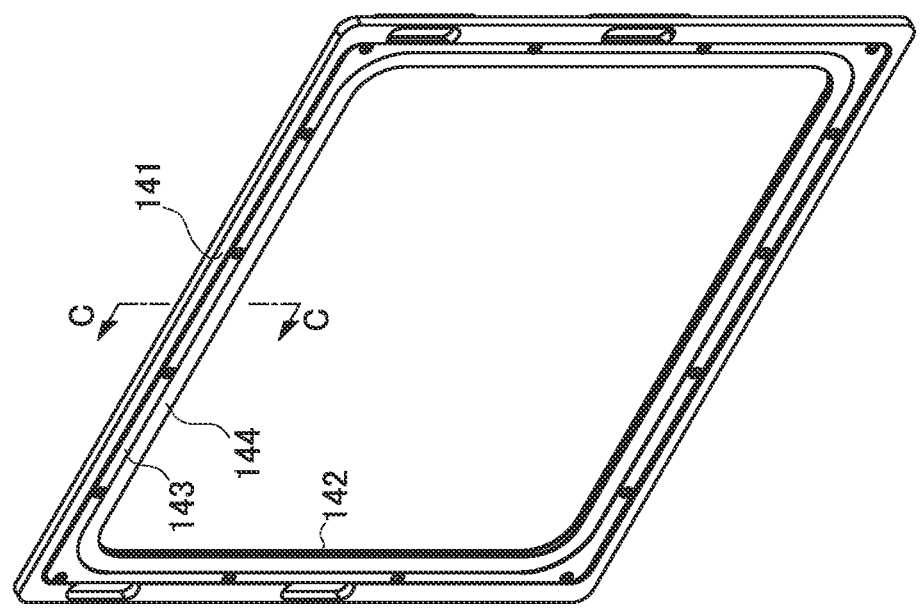

FIG. 15 shows a window unit 104 constituting a part of an EFEM 101 and load port 103 of a second embodiment. A door part 61 shown in this diagram is similar to the one in the first embodiment. Except for the window unit 104, the configuration is the same as the first embodiment. In this embodiment, the same parts as those in the first embodiment are denoted by the same reference numerals, and a description thereof will be omitted.

In the window unit 104, a gasket 144 as a plate-shaped elastic member is provided in front of a window frame part 141 and in the vicinity of a peripheral edge of an opening 142. The gasket 144 is formed in a substantially rectangular frame shape, and its inside is the same size as the opening 142. The gasket 144 is fixed to be held between a stop plate 143 and a window frame part 141 formed similarly in a substantially rectangular frame shape.

Figure 16:
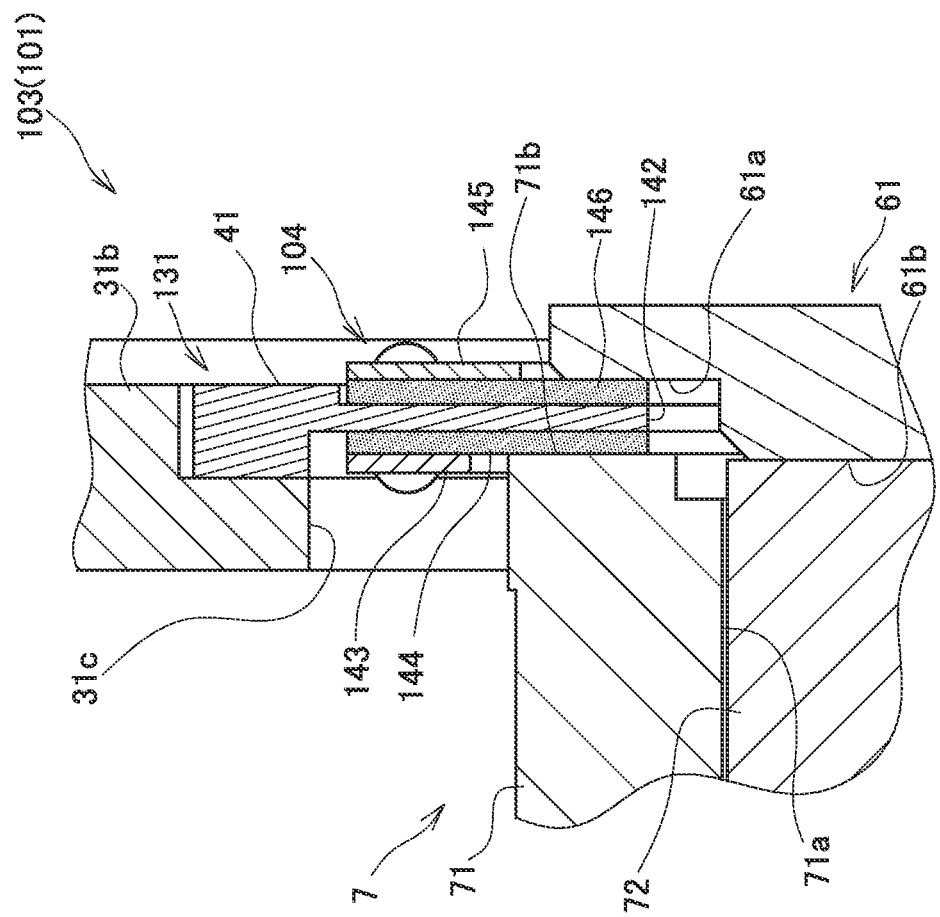
FIG. 16 is an enlarged perspective view of an essential part showing an enlarged C-C cross section in FIG. 15.

As shown in FIG. 16, on the rear side of the window frame part 141, similar to the front side, a gasket 146 as a plate-shaped elastic member formed similarly in a substantially rectangular frame shape is fixed by a stop plate 145 that is formed similarly in a substantially rectangular frame shape.

The gaskets 144 and 146 are made of rubber material with a less transmission of gas, and abutted to the abutment surface 71b of the FOUP 7 or the thin portion 61a of the door part 61, thereby enhancing the sealing property.

The gaskets 144 and 146 can be appropriately changed in hardness and thickness, thereby increasing an area contacting the abutment surface 71b of the FOUP 7 and the door part 61, and enabling a design for increasing the adhesion performance. Thus, it is unnecessary to provide the clamp unit 5 in the window frame part 141 as in the first embodiment. However, when a higher sealing property is required to increase a pressure difference between the inside and the outside, the clamp unit 5 may be provided to enhance the adhesion performance.

Even in the above configuration, it is possible to obtain the same effects as the first embodiment.

Since the elastic member for sealing is formed in a plate shape, it is possible to configure a sealing structure at a low cost.

Third Embodiment

Figure 17:
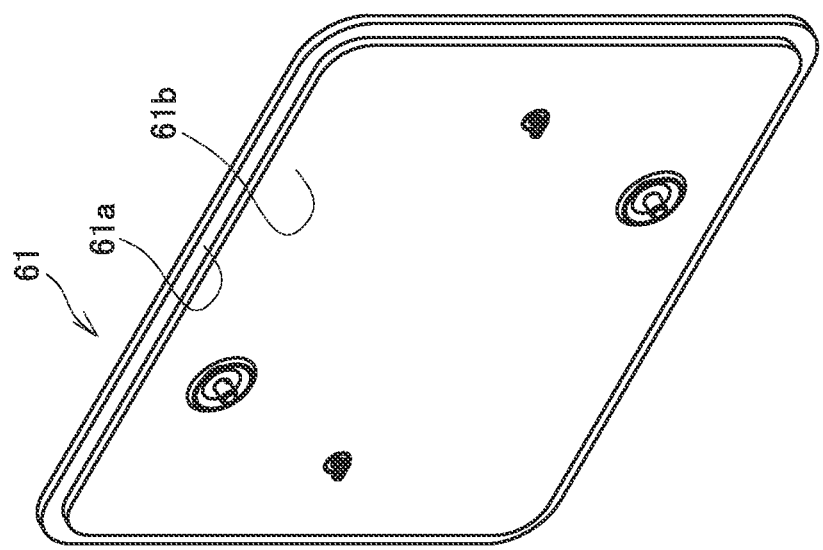
FIG. 17 is an enlarged perspective view of an essential part showing a window unit and a door part constituting a load port according to a third embodiment of the invention.
Figure 17:
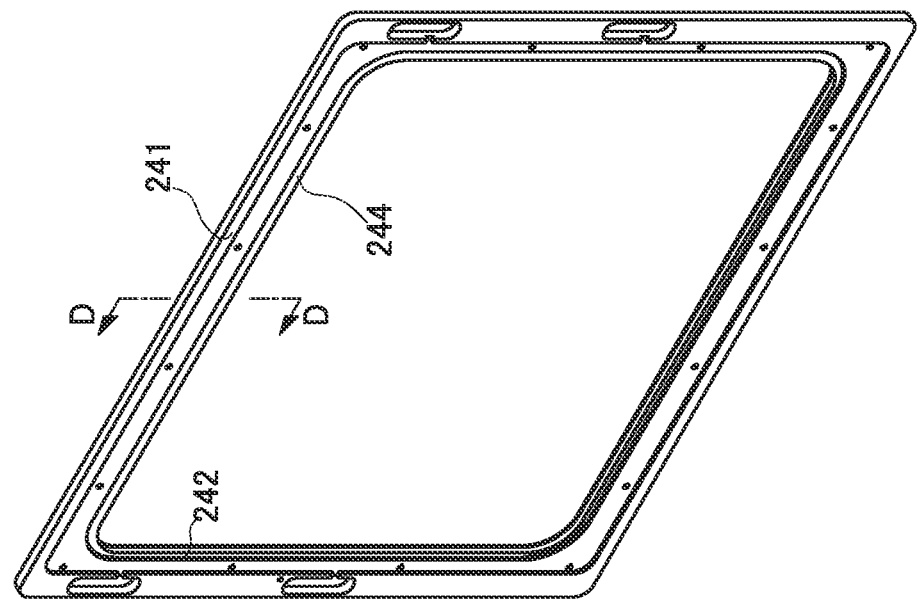

FIG. 17 shows a window unit 204 constituting a part of an EFEM 201 and load port 203 of a third embodiment. A door part 61 shown in this diagram is similar to the one in the first and second embodiments. Except for the window unit 204, the configuration is the same as the first embodiment. In this embodiment, the same parts as those in the first and second embodiments are denoted by the same reference numerals, and a description thereof will be omitted.

In the window unit 204, a seal member 244 as an elastic member is provided in the vicinity of a peripheral edge of an opening 242 of a window frame part 241. In particular, a seal member 244 as an elastic member is provided so as to extrude slightly inside of a peripheral edge of the opening 242.

Figure 18:
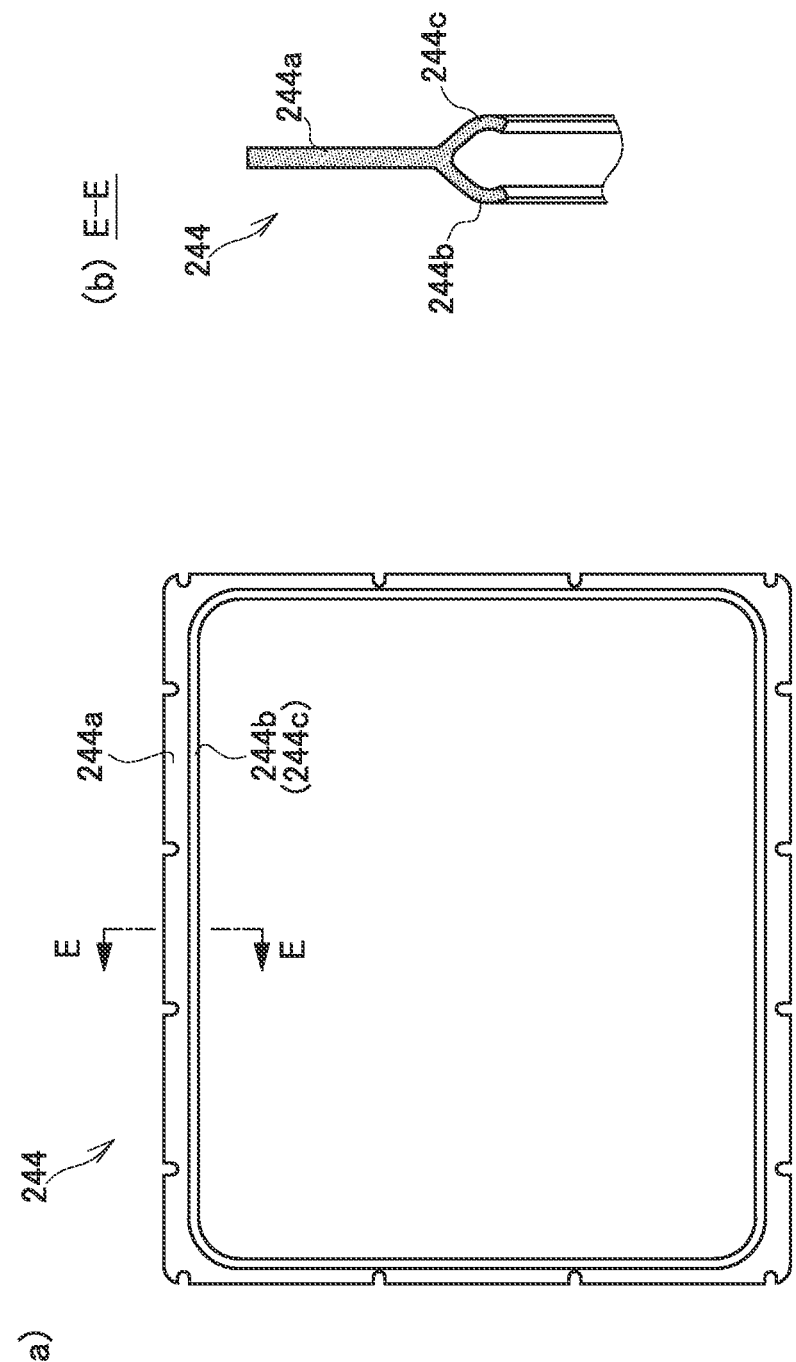
FIGS. 18 (a) and (b) are explanatory diagrams showing a seal member to be attached in the vicinity of an opening of the window unit.

The seal member 244 is formed in a substantially rectangular frame shape as shown in FIG. 18 (*a*). As in the cross section shown in FIG. 18 (*b*), a flat plate portion 244a is formed on the outer periphery, and two elastic portions 244b and 244c are branched into an inverted Y-shape and formed on the inner periphery. The elastic portions 244b and 244c are shaped to protrude from the inside of the flat plate portion 244a, and curved forward and rearward so as to form a convex. Being formed in such a shape, the elastic portions 244b and 244c have a large margin of deformation, and can be easily deformed in the longitudinal direction.

From a different point of view, the seal member 244 is integrally configured of the elastic portion 244b as an elastic member protruding forward to make sealing between the FOUP 7, and the elastic portion 244c as an elastic member protruding forward to make sealing between the door part 61, through the flat plate portion 244a.

Figure 19:
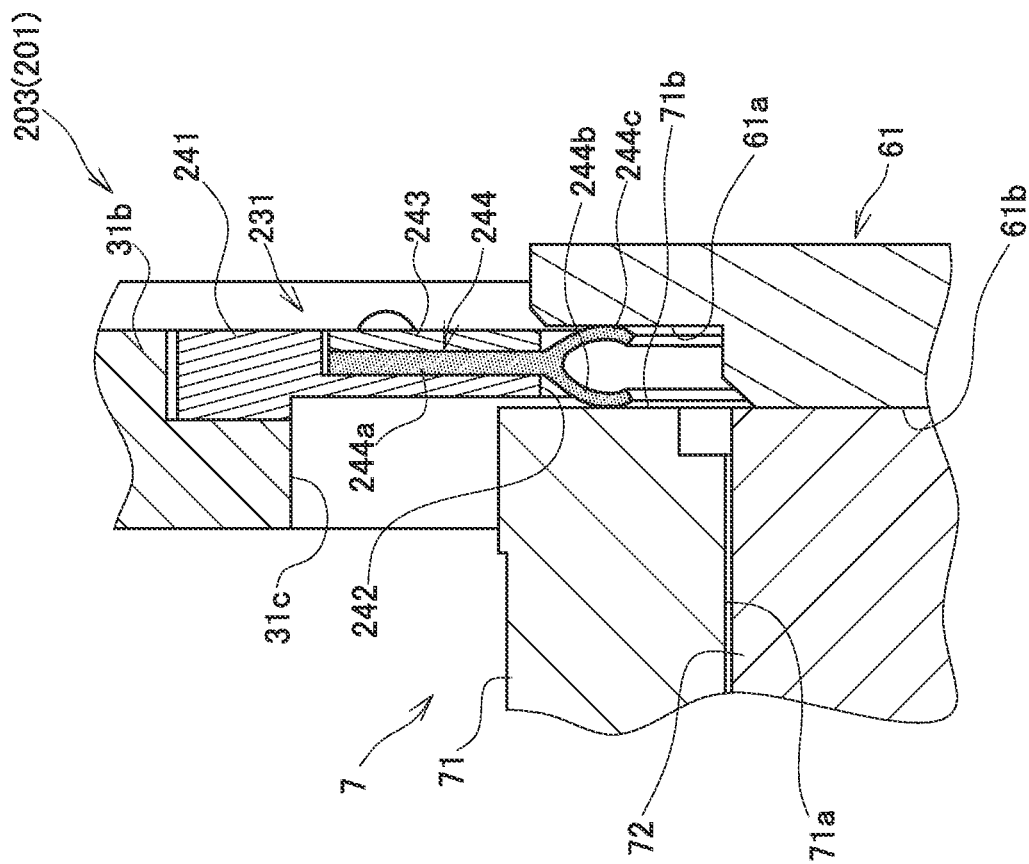
FIG. 19 an enlarged perspective view of an essential part showing an enlarged D-D cross section in FIG. 17.

The seal member 244 is, as shown in FIG. 19, fixed so as to hold the flat plate portion 244 between the window frame part 241 and the substantially frame-shaped stop plate 243 provided on the rear thereof, so that the elastic portions 244b and 244c are located more inside than the opening 242 of the window frame part 241.

The elastic portions 244b and 244c can make sealing by elastically contacting the abutment surface 71b of the FOUP 71 and the thin portion 61a of the door part 61. At this time, since the elastic portions 244b and 244c can be elastically and largely deformed, it is possible to increase and uniform the area contacting the abutment surface 71b of the FOUP 71 and the thin portion 61a of the door part 61. Thus, similar to the second embodiment, it is unnecessary to provide the clamp unit 5 in the window frame part 141 as in the first embodiment. However, when a higher sealing property is required, the clamp unit 5 may be provided to enhance the adhesion performance.

Even in the above configuration, it is possible to obtain the same effects as the first embodiment.

Since the elastic portion 244b as an elastic member provided on the mounting table 34 side to make sealing and the elastic portion 244c as an elastic member provided on the door part 61 side are integrated, it is possible to configure a sealing structure with a less number of parts, and reduce the production cost.

A specific structure of each part is not limited only to the aforementioned embodiments.

For example, in the aforementioned embodiments, the panel 31 as a plate-shaped part is configured by attaching the window unit 4 to the panel main body 31b. They can also be integrated without separating. In particular, the window frame part 41 constituting the window unit 5 may be integrated without dividing from the panel main body 31b.

Figure 20:
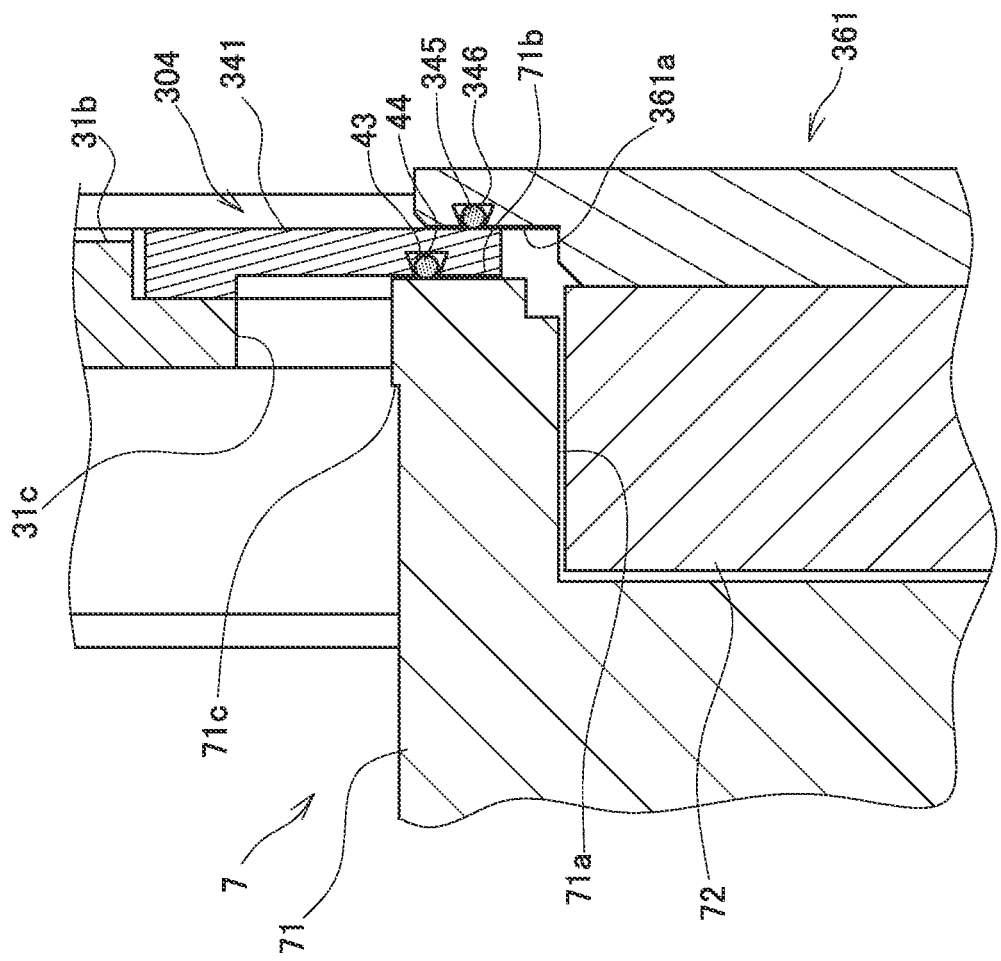
FIG. 20 is an enlarged perspective view of an essential part corresponding to FIG. 12 showing a modification of a load port according to a first embodiment of the invention.

Further, in the first embodiment, the O-ring 46 is provided on the rear side of the window frame part 41 for sealing between the window frame part 41 and the door part 61. However, as shown in FIG. 20, a window unit 304 and a door part 361 may be deformed. In other words, a dovetail groove 345 may be formed in a thin portion 361a of the door part 361, not on the rear side of a window frame part 341, and an O-ring 346 may be inserted therein. Even in this configuration, it is possible to obtain the same sealing property by contacting the thin portion 361a of the door part 361 and the rear side of the window frame part 341 through the O-ring 346.

In the aforementioned embodiments, the gas supply nozzle 34c as a gas supply means is incorporated into the mounting table 34, and gas is supplied to the FOUP 7 from the lower side, configuring a so-called bottom purge system. However, the gas supply nozzle 34c may be incorporated into the door part 61, and gas is supplied to the FOUP 7 from the front side, configuring a so-called front purge system. Further, even if the load port 3 is not provided with a gas supply means, it is possible to obtain the same effects by previously supplying gas to the FOUP 3 configured separately from the load port 3 to increase the internal pressure by using a gas supply unit, such as a purge station or the like, and then mounting the FOUP 3 on the load port 3.

Further, in the aforementioned embodiments, a nitrogen gas is used as a gas to be supplied to the EFEM 1 and FOUP 7. It is possible to use a wide variety of gases such as air and ozone according to the process.

Further, in the aforementioned embodiments, the FOUP 7 is used as a wafer storage container. Even if a wafer storage container of other types is used, it is possible to configure the same structure, and obtain the same effects.

Other configurations may be variously modified without departing from the scope of the invention.

DESCRIPTION OF REFERENCE NUMERALS

1 EFEM
2 Wafer transport chamber (Housing)
3 Load port
5 Clamp unit (Pulling means)
7 FOUP (Wafer storage container)
31 Panel (Plate-shaped part)
34 Mounting table
34c Gas supply nozzle (Gas supply means)
37 Gasket (Seal member)
42 Opening
44, 46 O-ring (Elastic member)
51 Engaging piece
61 Door part
71c Flange part
72 Lid part
73 Gas supply valve
144, 146 Gasket (Elastic member)
244b, 244c Elastic portion (Elastic member)
W Wafer

What is claimed is:

1. A load port that is provided adjacent to a wafer transport chamber for taking in and out a wafer between the wafer transport chamber and a wafer storage container, comprising:
    a plate-shaped part that constitutes a part of a wall of the wafer transport chamber, and has an opening for opening the wafer transport chamber;
    a door part for opening and closing the opening; and
    a transport chamber seal provided between the door part and the plate-shaped part along a peripheral edge of the opening on the outer peripheral side of the peripheral edge of the opening;
    wherein the concentration of gas in the internal space of the wafer transport chamber is increased by supplying the gas,
    when the door part closes the opening,
    the plate-shaped part elastically contacts the door part through the transport chamber seal, and suppresses a gas leakage to the outside from the wafer transport chamber.

2. The load port according to claim 1, further comprising a dovetail groove around the opening, wherein the transport chamber seal is inserted therein.

3. The load port according to claim 1, wherein the transport chamber seal is provided on the door part.

4. The load port according to claim 1, configured to mount a wafer storage container so as to oppose a lid part for opening and closing an internal space of the wafer storage container to the door part, and to move to and from the plate-shaped part; comprising
    a container seal that is provided between the plate-shaped part and the wafer storage container along a peripheral edge of the opening;
    wherein the container seal elastically contacts the periphery of the lid part in the wafer storage container by moving wafer storage container toward the plate-shaped part, and the internal space of the wafer storage container is in communication with the internal space of the wafer transport chamber by separating the lid part of the wafer storage container with the door part from the plate-shaped part, and then, an outflow and inflow of the gas between the outside and the internal space is suppressed.

5. The load port according to claim 4, further comprising a mounting table that is configured to mount a wafer storage container so as to move to and from the plate-shaped part;
    wherein the container seal elastically contacts the periphery of the lid part in the wafer storage container by moving the mounting table toward the plate-shaped part.

6. The load port according to claim 5, further comprising a clamp unit that is configured to pull a flange part arranged on both sides of the wafer storage container toward the plate-shaped part.

7. The load port according to claim 4, wherein the transport chamber seal is provided at the inner peripheral side of the container seal.

8. The load port according to claim 7, wherein the transport chamber seal is provided on the plate-shaped part together with the container seal.

9. The load port according to claim 4, further comprising a dovetail groove formed in the plate-shaped part, and the container seal is inserted therein.

10. The load port according to claim 1, wherein a thin portion provided on the outer periphery of the door part abuts the transport chamber seal.

11. The load port according to claim 10, further comprising a dovetail groove formed in the thin portion, and the transport chamber seal is inserted therein.

12. The load port according to claim 10, wherein a gap is secured between the thin part of the door and the main body of the wafer storage container.

13. An EFEM comprising a wafer transport chamber and a load port for taking in and out a wafer between the wafer transport chamber and a wafer storage container,
wherein the load port comprising:
a plate-shaped part that constitutes a part of a wall of the wafer transport chamber, and has an opening for opening the wafer transport chamber;
a door part for opening and closing the opening; and
a transport chamber seal provided between the door part and the plate-shaped part along a peripheral edge of the opening on the outer peripheral side of the peripheral edge of the opening; and
the load port is configured so that when the pressure in the internal space is higher than the external pressure by supplying the gas, and
the door part closes the opening,
and the plate-shaped part elastically contacts the door part through the transport chamber seal, and suppresses a gas leakage to the outside from the wafer transport chamber,
and when the internal space of the wafer storage container becomes in communication with the internal space of the wafer transport chamber by separating the lid part of the wafer storage container with the door part from the plate-shaped part, the pressure in the internal space of the wafer storage container is kept higher than the pressure in the internal space of the wafer transport chamber.

14. The EFEM according to claim 13, wherein the pressure in the internal space of the wafer storage container is increased through a gas line which supplies by supplying the gas from bottom of the wafer storage container.

15. The EFEM according to claim 13, wherein the wafer storage container is constructed to send a gas downward by a fan filter unit provided in the upper part of the wafer transport chamber, suck the gas through a chemical filter provided in the lower part, and return the gas to the fan filter unit in the upper part through a circulation duct provided adjacent to the inside of the rear side.

* * * * *

UNITED STATES PATENT AND TRADEMARK OFFICE
CERTIFICATE OF CORRECTION

PATENT NO. : 10,727,100 B2
APPLICATION NO. : 16/394344
DATED : July 28, 2020
INVENTOR(S) : Mitsutoshi Ochiai et al.

Page 1 of 1

It is certified that error appears in the above-identified patent and that said Letters Patent is hereby corrected as shown below:

On the Title Page

Change:
(30) Foreign Application Priority Data
Jan. 28, 2015 (JP)....2014-017819

To be:
(30) Foreign Application Priority Data
Jan. 31, 2014 (JP)....2014-017819

Signed and Sealed this
Tenth Day of November, 2020

Andrei Iancu
*Director of the United States Patent and Trademark Office*